(12) United States Patent
Hata et al.

(10) Patent No.: US 7,968,897 B2
(45) Date of Patent: Jun. 28, 2011

(54) LIGHT-EMITTING DEVICE HAVING A SUPPORT SUBSTRATE AND INCLINED SIDES

(75) Inventors: Masayuki Hata, Kadoma (JP); Tatsuya Kunisato, Takatsuki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/059,508

(22) Filed: Feb. 17, 2005

(65) Prior Publication Data

US 2005/0199885 A1    Sep. 15, 2005

(30) Foreign Application Priority Data

Mar. 9, 2004  (JP) ................. 2004-065489

(51) Int. Cl.
*H01L 33/00* (2010.01)
(52) U.S. Cl. .......................... 257/98; 257/99
(58) Field of Classification Search ............ 257/98, 257/99
See application file for complete search history.

(56) References Cited

U.S. PATENT DOCUMENTS

| | | | |
|---|---|---|---|
| 4,473,938 A * | 10/1984 | Kobayashi et al. ............ 438/22 |
| 5,187,547 A | 2/1993 | Niina et al. | |
| 5,278,433 A * | 1/1994 | Manabe et al. ............... 257/103 |
| 6,229,160 B1 * | 5/2001 | Krames et al. .................. 257/94 |
| 6,333,522 B1 | 12/2001 | Inoue et al. | |
| 6,337,493 B1 * | 1/2002 | Tanizawa et al. .............. 257/79 |
| 6,495,862 B1 * | 12/2002 | Okazaki et al. ............... 257/103 |
| 6,597,019 B2 | 7/2003 | Inoue et al. | |
| 6,657,236 B1 * | 12/2003 | Thibeault et al. .............. 257/98 |
| 6,744,071 B2 | 6/2004 | Sano et al. | |
| 6,897,488 B2 | 5/2005 | Baur et al. | |
| 6,916,676 B2 | 7/2005 | Sano et al. | |
| 6,936,861 B2 | 8/2005 | Hata et al. | |
| 6,946,683 B2 | 9/2005 | Sano et al. | |
| 7,019,330 B2 * | 3/2006 | Ludowise ....................... 257/79 |
| 7,109,527 B2 * | 9/2006 | Illek et al. ....................... 257/95 |
| 7,154,125 B2 | 12/2006 | Koide et al. | |
| 7,193,246 B1 * | 3/2007 | Tanizawa et al. .............. 257/94 |
| 2004/0026709 A1 | 2/2004 | Bader et al. | |
| 2004/0033638 A1 | 2/2004 | Bader et al. | |
| 2004/0056254 A1 | 3/2004 | Bader et al. | |
| 2005/0282373 A1 | 12/2005 | Bader et al. | |
| 2006/0011925 A1 | 1/2006 | Bader et al. | |
| 2006/0231852 A1 | 10/2006 | Kususe et al. | |

(Continued)

FOREIGN PATENT DOCUMENTS

CN    1473364 A1    2/2004

(Continued)

OTHER PUBLICATIONS

Chinese Office Action issued in Chinese Patent Application No. CN 2005100084703, dated Feb. 1, 2008.

(Continued)

*Primary Examiner* — Howard Weiss
(74) *Attorney, Agent, or Firm* — McDermott Will & Emery LLP

(57) ABSTRACT

A light-emitting device capable of improving light extraction efficiency is provided. This light-emitting device comprises a support substrate set on a side opposite to a light emission surface and a semiconductor element layer, bonded to the support substrate, having a side surface inclined by a prescribed angle with respect to at least the normal of the light emission surface.

19 Claims, 19 Drawing Sheets

U.S. PATENT DOCUMENTS

2007/0012944 A1    1/2007    Bader et al.

FOREIGN PATENT DOCUMENTS

| | | |
|---|---|---|
| JP | 6-244458 | 9/1994 |
| JP | 6-291368 | 10/1994 |
| JP | 07-131066 | 5/1995 |
| JP | 9-008403 | 1/1997 |
| JP | 9-8403 | 1/1997 |
| JP | 09-008403 | 1/1997 |
| JP | 09-092878 | 4/1997 |
| JP | 10-163525 | 6/1998 |
| JP | 10-341035 | 12/1998 |
| JP | 2000-196152 | 7/2000 |
| JP | 2001-230448 | 8/2001 |
| JP | 2003-174193 | 6/2003 |
| JP | 2003-309289 | 10/2003 |
| JP | 2003-532298 | 10/2003 |
| JP | 2003-347589 | 12/2003 |
| JP | 2005-085932 | 3/2005 |
| WO | WO 03/058726 * | 7/2003 ............ 257/98 |
| WO | WO 2004/013916 A1 | 2/2004 |

OTHER PUBLICATIONS

Chinese Office Action, with English Translation, issued in Chinese Patent Application No. CN 2005100084703 dated on Jul. 18, 2008.

Chinese Office Action, with English translation, issued in Chinese Patent Application No. CN 2005100084703, mailed Dec. 12, 2008.

Japanese Notification of Reason(s) for Rejection, w/ English translation thereof, issued in Japanese Patent Application No. JP 2004-065489 dated Mar. 10, 2009.

Japanese Office Action, with English translation, issued in Japanese Patent Application No. 2004-065489, mailed Dec. 1, 2009.

* cited by examiner

LIGHT-EMITTING DEVICE HAVING A SUPPORT SUBSTRATE AND INCLINED SIDES

BACKGROUND OF THE INVENTION

1. Field of the Invention

The present invention relates to a light-emitting device and a method of manufacturing the same, and more particularly, it relates to a light-emitting device comprising a semiconductor element layer and a method of manufacturing the same.

2. Description of the Background Art

A light-emitting device such as a light-emitting diode device employing a nitride-based semiconductor is actively developed at present. In order to apply a light-emitting diode device employing a nitride-based semiconductor to a light source for a lighting apparatus, improvement of the light output characteristic of the device and increase of an applied current have recently been developed in particular. In order to form such a light-emitting diode device employing a nitride-based semiconductor, a semiconductor element layer is grown on a sapphire substrate requiring a lower cost than a high-priced substrate of GaN.

Further, a light-emitting diode device emitting light created in a semiconductor element layer (emission layer) from the side of a sapphire substrate employed as a growth substrate for growing the semiconductor element layer is known in general. In addition, a technique of improving light extraction efficiency in the aforementioned light-emitting diode device emitting light from the side of the sapphire substrate by inclining the side surfaces of the device by a prescribed angle is also known in general, as disclosed in Japanese Patent Laying-Open No. 6-244458 (1994) or 10-341035 (1995), for example.

The aforementioned Japanese Patent Laying-Open No. 6-244458 or 10-341035 discloses a light-emitting diode device formed by growing a semiconductor element layer on a translucent substrate such as a sapphire substrate so that a light emission surface (surface of the translucent substrate) and the side surfaces of the translucent substrate and the semiconductor element layer form an acute angle. According to the aforementioned Japanese Patent Laying-Open No. 6-244458 or 10-341035, light totally reflected on the light emission surface is incident upon the side surfaces inclined by a prescribed angle with respect to the light emission surface, whereby the path of the light can be so changed that the angle of incidence of the light with respect to the light emission surface is smaller than the critical angle. Thus, the light totally reflected on the light emission surface can also be emitted, whereby the light extraction efficiency can be improved.

According to the aforementioned Japanese Patent Laying-Open No. 6-244458 or 10-341035, however, the light emitted from the side of the transparent substrate passes through the interface between the transparent substrate and the semiconductor element layer. In this case, the light is disadvantageously reflected on the interface between the transparent substrate and the semiconductor element layer due to different refractive indices of the transparent substrate and the semiconductor element layer. Therefore, the quantity of light emitted from the light emission surface (surface of the translucent substrate) is disadvantageously reduced despite the side surfaces of the device inclined for improving the light extraction efficiency. Consequently, it is problematically difficult to improve the light extraction efficiency.

SUMMARY OF THE INVENTION

The present invention has been proposed in order to solve the aforementioned problem, and an object of the present invention is to provide a light-emitting device capable of improving light extraction efficiency.

Another object of the present invention is to provide a method of manufacturing a light-emitting device capable of improving light extraction efficiency.

In order to attain the aforementioned objects, a light-emitting device according to a first aspect of the present invention comprises a support substrate set on a side opposite to a light emission surface and a semiconductor element layer, bonded to the support substrate, having a side surface inclined by a prescribed angle with respect to at least the normal of the light emission surface.

In the light-emitting device according to the first aspect, as hereinabove described, the support substrate is set on the side opposite to the light emission surface while the semiconductor element layer is bonded to the support substrate so that light created in the semiconductor element layer can be emitted from the light emission surface opposite to the support substrate, whereby the light created in the semiconductor element layer can be emitted only through the semiconductor element layer. Thus, no light is reflected on the interface between a growth substrate and the semiconductor element layer dissimilarly to a case of emitting light from the side of a growth substrate employed for forming a conventional semiconductor element layer, whereby light extraction efficiency can be inhibited from reduction. Further, the semiconductor element layer is formed to have the side surface inclined by the prescribed angle with respect to the normal of the light emission surface, whereby light totally reflected on the light emission surface is incident upon the side surface inclined by the prescribed angle with respect to the normal of the light emission surface and the path of the light can be so changed that the angle of incidence of the light with respect to the light emission surface is smaller than the critical angle in consideration of the theory of geometrical optics. Consequently, the light totally reflected on the light emission surface can also be emitted, whereby the light extraction efficiency can be improved. Thus, the light extraction efficiency can be improved through the inclined side surface of the semiconductor element layer according to the first aspect, while inhibiting the light extraction efficiency from reduction resulting from reflection on the interface between a growth substrate and the semiconductor element layer. In addition, the semiconductor element layer is formed to have the side surface inclined by the prescribed angle with respect to the normal of the light emission surface so that the thickness of the semiconductor element layer is reduced toward a side end portion, whereby the thickness of the semiconductor element layer reaches the order of the emission wavelength in the vicinity of the side end portion thereof. In consideration of the theory of wave optics, a diffraction effect is increased in the vicinity of the side end portion of the semiconductor element layer having the thickness of the order of the emission wavelength. When the support substrate transmits no light in this case, the ratio of light propagated in the vicinity of the side end portion of the semiconductor element layer having the thickness of the order of the emission wavelength is increased. Thus, the traveling direction of light can be changed due to the diffraction effect according to the first aspect, whereby the quantity of light externally emitted from the semiconductor element layer can be increased. The light extraction effect can be improved also by this.

In the aforementioned light-emitting device according to the first aspect, the semiconductor element layer preferably has a structure obtained by stacking a plurality of layers, and the side surface of at least a partial semiconductor layer constituting the semiconductor element layer is preferably inclined by the prescribed angle with respect to the normal of the light emission surface. According to this structure, light totally reflected on the light emission surface is incident upon the side surface, inclined by the prescribed angle, of at least the partial semiconductor layer constituting the semiconductor element layer, whereby the path of the light can be so changed that the angle of incidence of light with respect to the light emission surface is smaller than the critical angle.

In this case, the side surfaces of all semiconductor layers constituting the semiconductor element layer are preferably inclined by the prescribed angle with respect to the normal of the light emission surface. According to this structure, the area of the inclined side surface of the semiconductor element layer is so increased that the quantity of light incident upon the inclined side surface of the semiconductor element layer can be increased.

In the aforementioned light-emitting device according to the first aspect, the light emission surface and the side surface of the semiconductor element layer preferably form an obtuse angle. According to this structure, the area of the surface of the semiconductor element layer closer to the support substrate is larger than that of the surface closer to the light emission side, whereby heat generated in the semiconductor element layer can be efficiently dissipated toward the support substrate. Further, the light emission surface and the side surface of the semiconductor element layer so form an obtuse angle that the support substrate and the semiconductor element layer form an acute angle, whereby fused solder more hardly reaches the side surface of the semiconductor element layer when the support substrate and the semiconductor element layer are bonded to each other through the solder as compared with a case where the support substrate and the semiconductor element layer form an obtuse angle. Thus, the light-emitting device can be inhibited from a defective short resulting from solder reaching the side surface of the semiconductor element layer. When an active layer (emission layer) included in the semiconductor element layer is arranged on the side closer to the support substrate than the light emission surface, the active layer can be inhibited from size reduction despite the obtuse angle formed by the light emission surface and the side surface of the semiconductor element layer.

The aforementioned light-emitting device according to the first aspect preferably further comprises a lateral reflecting film formed to extend along the side surface of the semiconductor element layer inclined by the prescribed angle. According to this structure, the quantity of light reflected toward the light emission side can be increased through the side surface of the semiconductor element layer inclined by the prescribed angle, whereby the light extraction efficiency can be further improved.

The aforementioned light-emitting device according to the first aspect preferably further comprises a reflecting film provided at least between the support substrate and the semiconductor element layer. According to this structure, light advancing toward the support substrate can be reflected toward the light emission side, whereby the light extraction efficiency can be further improved.

In the aforementioned structure having the reflecting film provided between the support substrate and the semiconductor element layer, a surface of the reflecting film closer to the semiconductor element layer is preferably corrugated. According to this structure, light incident upon the interface between the reflecting film and the semiconductor element layer is irregularly reflected or diffracted due to the corrugated surface of the reflecting film, whereby the direction of optical reflection is changed. Thus, reflected light is emitted from the light emission surface of the semiconductor element layer opposite to the reflecting film, whereby a light output characteristic can be improved.

In the aforementioned structure having the reflecting film provided between the support substrate and the semiconductor element layer, the reflecting film preferably functions also as an electrode. According to this structure, no electrode may be formed in addition to the reflecting film, whereby a manufacturing process for the light-emitting device can be simplified.

In the aforementioned light-emitting device according to the first aspect, the light emission surface is preferably corrugated. According to this structure, the light emission surface can be inhibited from totally reflecting light, whereby the light extraction efficiency can be further improved.

In the aforementioned light-emitting device according to the first aspect, the semiconductor element layer preferably has a structure obtained by stacking a plurality of semiconductor layers, and the semiconductor layer closer to the light emission side preferably consists of an undoped semiconductor among the plurality of semiconductor layers. According to this structure, the undoped semiconductor layer, formed with no impurity levels, can be inhibited from light absorption resulting from impurity levels. Therefore, the probability of light absorption can be more reduced as compared with a case where light totally reflected on the light emission surface passes through only a layer, doped with an impurity, easily causing light absorption resulting from impurity levels. Consequently, the light totally reflected on the light emission surface can be inhibited from absorption, whereby the light extraction efficiency can be further improved.

In this case, the undoped semiconductor layer preferably has an opening, and an electrode is preferably formed in the opening to be in contact with the surface of the semiconductor layer, other than the undoped semiconductor layer, doped with an impurity. According to this structure, the semiconductor element layer can be supplied with a current through the electrode formed in the opening of the undoped semiconductor layer provided on the light emission side.

In the aforementioned light-emitting device according to the first aspect, a single-layer film of particles is preferably formed on a surface of the semiconductor element layer closer to the light emission side. According to this structure, the ratio of the single-layer film of particles is gradually reduced while the ratio of an air space is gradually increased from the side of the single-layer film of particles toward the air space on the interface between the single-layer film of particles and the air space, whereby the refractive index can be gradually changed from that of the single-layer film of particles to that of the air space. Thus, Fresnel reflection of light can be reduced on the interface between the single-layer film of particles and the air space.

In the aforementioned light-emitting device according to the first aspect, the support substrate preferably includes a conductive substrate. According to this structure, two electrodes can be arranged to be opposite to each other through the semiconductor element layer. Thus, the light emission area can be more increased as compared with a light-emitting device employing an insulating substrate having two electrodes arranged only on one side of a semiconductor element layer, whereby the light extraction efficiency can be further improved.

A method of manufacturing a light-emitting device according to a second aspect of the present invention comprises steps of forming a semiconductor element layer having a side surface inclined by a prescribed angle with respect to at least the normal of a light emission surface on a growth substrate, setting a support substrate on a side opposite to the light emission surface, bonding the semiconductor element layer to the support substrate and removing the growth substrate.

In the method of manufacturing a light-emitting device according to the second aspect, as hereinabove described, the semiconductor element layer having the side surface inclined by the prescribed angle with respect to at least the normal of the light emission surface is formed on the growth substrate, the support substrate is thereafter set on the side opposite to the light emission surface while the semiconductor element layer is bonded to the support substrate and the growth substrate is removed so that light created in the semiconductor element layer can be emitted from the light emission surface opposite to the support substrate, whereby the light created in the semiconductor element layer can be emitted only through the semiconductor element layer. Thus, no light is reflected on the interface between the growth substrate and the semiconductor element layer dissimilarly to a case of emitting light from the side of a growth substrate employed for forming a conventional semiconductor element layer, whereby a light-emitting device capable of suppressing reduction of light extraction efficiency can be easily formed. Further, the semiconductor element layer is formed to have the side surface inclined by the prescribed angle with respect to the normal of the light emission surface, whereby light totally reflected on the light emission surface is incident upon the side surface inclined by the prescribed angle with respect to the normal of the light emission surface and the path of the light can be so changed that the angle of incidence of light with respect to the light emission surface is smaller than the critical angle in consideration of the theory of geometrical optics. Consequently, the light totally reflected on the light emission surface can also be emitted, whereby a light-emitting device capable of improving the light extraction efficiency can be easily formed. Thus, a light-emitting device capable of improving the light extraction efficiency through the inclined side surface of the semiconductor element layer while inhibiting the light extraction efficiency from reduction resulting from reflection on the interface between the growth substrate and the semiconductor element layer can be easily formed according to the second aspect. In addition, the semiconductor element layer is formed to have the side surface inclined by the prescribed angle with respect to the normal of the light emission surface so that the thickness of the semiconductor element layer is reduced toward a side end portion, whereby the thickness of the semiconductor element layer reaches the order of the emission wavelength in the vicinity of the side end portion thereof. In consideration of the theory of wave optics, a diffraction effect is increased in the vicinity of the side end portion of the semiconductor element layer having the thickness of the order of the emission wavelength. When the support substrate transmits no light in this case, the ratio of light propagated in the vicinity of the side end portion of the semiconductor element layer having the thickness of the order of the emission wavelength is increased. Thus, the traveling direction of light can be changed due to the diffraction effect according to the second aspect, whereby the quantity of light externally emitted from the semiconductor element layer can be increased. The light extraction effect can be improved also by this.

In the aforementioned method of manufacturing a light-emitting device according to the second aspect, the step of forming the semiconductor element layer preferably includes steps of forming the semiconductor element layer obtained by stacking a plurality of semiconductor layers on the growth substrate, forming a trapezoidal mask layer on the surface of the semiconductor element layer and forming the side surface of at least a partial semiconductor layer constituting the semiconductor element layer in a shape inclined by the prescribed angle with respect to the normal of the light emission surface by reflecting the trapezoidal shape of the mask layer by simultaneously etching the mask layer and the semiconductor element layer. According to this structure, the side surface of at least a partial semiconductor layer constituting the semiconductor element layer can be easily inclined by the prescribed angle with respect to the normal of the light emission surface. Thus, light totally reflected on the light emission surface is incident upon the side surface of at least a partial semiconductor layer constituting the semiconductor element layer inclined by the prescribed angle with respect to the normal of the light emission surface and the path of the light can be so changed that the angle of incidence of light with respect to the light emission surface is smaller than the critical angle. In addition, the thickness of the semiconductor element layer can be reduced toward the side end portion, whereby the traveling direction of light can be easily changed due to the diffraction effect. Thus, the quantity of light externally emitted from the semiconductor element layer can be easily increased, whereby the light extraction effect can be improved.

In the aforementioned method of manufacturing a light-emitting device according to the second aspect, the step of bonding the semiconductor element layer to the support substrate preferably includes a step of bonding the semiconductor element layer to the support substrate through a reflecting film. According to this structure, light advancing toward the support substrate can be reflected toward the light emission side, whereby the light extraction effect can be further improved.

In the aforementioned structure including the step of bonding the semiconductor element layer to the support substrate through the reflecting film, the method of manufacturing a light-emitting device preferably further comprises steps of forming a latticed insulating film on the surface of the semiconductor element layer and forming the reflecting film having a corrugated surface closer to the semiconductor element layer by forming the reflecting film on the latticed insulating film to be in contact with the surface of the semiconductor element layer in advance of the step of bonding the semiconductor element layer to the support substrate. According to this structure, the surface of the reflecting film closer to the semiconductor element layer can be easily corrugated. In this case, light incident upon the interface between the reflecting film and the semiconductor element layer is irregularly reflected or diffracted due to the corrugated surface of the reflecting film, whereby the direction of optical reflection is changed. Thus, reflected light is emitted from the light emission surface of the semiconductor element layer opposite to the reflecting film, whereby a light output characteristic can be improved.

In the aforementioned method of manufacturing a light-emitting device according to the second aspect, the step of forming the semiconductor element layer preferably includes steps of forming a latticed insulating film on the growth substrate and corrugating a surface of the semiconductor element layer closer to the light emission side by forming the semiconductor element layer on the latticed insulating film to fill up a region not formed with the insulating film. According to this structure, the surface of the semiconductor element layer closer to the light emission side can be easily corrugated. Thus, the light emission surface can be inhibited from totally reflecting light, whereby the light extraction efficiency can be further improved.

In the aforementioned method of manufacturing a light-emitting device according to the second aspect, the step of forming the semiconductor element layer preferably includes steps of forming a single-layer film of particles on the growth substrate and forming the semiconductor element layer on the single-layer film of particles. According to this structure, the ratio of the single-layer film of particles is gradually reduced while the ratio of an air space is gradually increased from the side of the single-layer film of particles toward the air space on the interface between the single-layer film of particles and the air space, whereby the refractive index can be gradually changed from that of the single-layer film of particles to that of the air space. Thus, Fresnel reflection of light can be reduced on the interface between the single-layer film of particles and the air space.

In the aforementioned method of manufacturing a light-emitting device according to the second aspect, the step of forming the semiconductor element layer preferably includes a step of forming the semiconductor element layer corresponding to a plurality of devices on the growth substrate, and the method of manufacturing a light-emitting device preferably further comprises a step of separating the semiconductor element layer into the respective devices after the step of removing the growth substrate. According to this structure, a plurality of devices each including a semiconductor element layer having a side surface inclined by a prescribed angle with respect to the normal of a light emission surface can be easily formed at the same time.

In each of the light-emitting device and the method of manufacturing a light-emitting device according to the aforementioned first and second aspects, the semiconductor element layer may include a nitride-based semiconductor element layer. According to this structure, the light extraction efficiency can be easily improved in the light-emitting element including the nitride-based semiconductor element layer.

In the aforementioned structure including the step of simultaneously etching the mask layer and the semiconductor element layer, the step of forming the side surface of at least a partial semiconductor layer constituting the semiconductor element layer in the shape inclined by the prescribed angle with respect to the normal of the light emission surface may include a step of forming the side surfaces of all semiconductor layers constituting the semiconductor element layer in the shape inclined by the prescribed angle with respect to the normal of the light emission surface. According to this structure, the side surfaces of all semiconductor layers constituting the semiconductor element layer can be inclined by the prescribed angle with respect to the normal of the light emission surface. Thus, the area of the inclined side surface of the semiconductor element layer is so increased that the quantity of light incident upon the inclined side surface of the semiconductor element layer can be increased.

In the aforementioned structure including the step of simultaneously etching the mask layer and the semiconductor element layer, the mask layer may include a mask layer of Al. According to this structure, the side surface of at least a partial semiconductor layer constituting the semiconductor element layer can be easily inclined by the prescribed angle with respect to the normal of the light emission surface by simultaneously etching the mask layer of Al and the semiconductor element layer.

In the aforementioned structure including the step of simultaneously etching the mask layer and the semiconductor element layer, the step of forming the side surface of at least a partial semiconductor layer constituting the semiconductor element layer in the shape inclined by the prescribed angle with respect to the normal of the light emission surface may include a step of forming the side surface of the semiconductor layer in the shape inclined by the prescribed angle with respect to the normal of the light emission surface so that the light emission surface and the side surface of the semiconductor layer form an obtuse angle. According to this structure, the light emission surface and the side surface of the semiconductor element layer can easily form an obtuse angle. Thus, the area of the surface of the semiconductor element layer closer to the support substrate is larger than that of the surface closer to the light emission side, whereby heat generated in the semiconductor element layer can be efficiently dissipated toward the support substrate. Further, the light emission surface and the side surface of the semiconductor element layer so form an obtuse angle that the support substrate and the semiconductor element layer form an acute angle, whereby fused solder more hardly reaches the side surface of the semiconductor element layer when the support substrate and the semiconductor element layer are bonded to each other through the solder as compared with a case where the support substrate and the semiconductor element layer form an obtuse angle. Thus, a defective short resulting from solder reaching the side surface of the semiconductor element layer can be suppressed. When an active layer (emission layer) included in the semiconductor element layer is arranged on a side closer to the support substrate than the light emission surface, the active layer can be inhibited from size reduction despite the obtuse angle formed by the light emission surface and the semiconductor element layer.

The aforementioned method of manufacturing a light-emitting device according to the second aspect may further comprise a step of forming a lateral reflecting film to extend along the side surface, inclined by the prescribed angle, of the semiconductor element layer after the step of forming the semiconductor element layer. According to this structure, the quantity of light reflected on the side surface, inclined by the prescribed angle, of the semiconductor element layer toward the light emission side can be so increased that the light extraction efficiency can be further improved.

In the aforementioned structure including the step of bonding the semiconductor element layer to the support substrate through the reflecting film, the reflecting film may function also as an electrode. According to this structure, no electrode may be formed in addition to the reflecting film, whereby the manufacturing process can be simplified.

In the aforementioned method of manufacturing a light-emitting device according to the second aspect, the step of forming the semiconductor element layer may include a step of forming the semiconductor element layer obtained by arranging an undoped semiconductor layer on the light emission side on the growth substrate. According to this structure, the undoped semiconductor layer, formed with no impurity levels, can be inhibited from light absorption resulting from impurity levels. Therefore, the probability of light absorption can be more reduced as compared with a case where light totally reflected on the light emission surface passes through only a layer, doped with an impurity, easily causing light absorption resulting from impurity levels. Consequently, the light totally reflected on the light emission surface can be inhibited from absorption, whereby the light extraction efficiency can be further improved.

In this case, the method of manufacturing a light-emitting device may further comprise steps of forming an opening in the undoped semiconductor layer and forming an electrode in the opening to be in contact with the surface of the semiconductor layer, other than the undoped semiconductor layer, doped with an impurity, after the step of forming the semiconductor element layer. According to this structure, the semiconductor element layer can be supplied with a current through the electrode formed in the opening of the undoped semiconductor layer provided on the side of the light emission surface.

In the aforementioned method of manufacturing a light-emitting device according to the second aspect, the support substrate may include a conductive substrate. According to this structure, two electrodes can be arranged to be opposite to each other through the semiconductor element layer. Thus, the light emission area can be more increased as compared with a light-emitting device employing an insulating substrate having two electrodes arranged only on one side of a semiconductor element layer, whereby the light extraction efficiency can be further improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
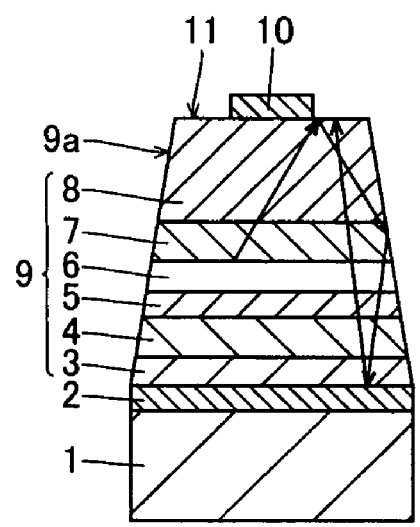
FIG. 1 is a sectional view showing the structure of a nitride-based semiconductor light-emitting diode device according to a first embodiment of the present invention.

The structure of a nitride-based semiconductor light-emitting diode device according to a first embodiment of the present invention is described with reference to FIG. 1. Referring to FIG. 1, arrows denote paths of light.

In the nitride-based semiconductor light-emitting diode device according to the first embodiment, a conductive support substrate 1 is set on a side opposite to a light emission surface 11, as shown in FIG. 1. The conductive support substrate 1 consists of a semiconductor, a metal or a conductive resin film or a composite material of a metal and a metal oxide. The semiconductor used for the support substrate 1 may be prepared from a cleavable semiconductor such as Si, SiC, GaAs or ZnO. The metal used for the support substrate 1 is prepared from Al, Fe—Ni or Cu—W. The conductive resin film used for the support substrate 1 is prepared from a conductive resin film containing conductive particles of a metal or the like dispersed therein. The composite material of a metal and a metal oxide used for the support substrate 1 is prepared from Cu—CuO or the like. A p-side electrode 2 obtained by successively forming an Ag layer having a thickness of about 200 nm and an Al layer having a thickness of about 5 nm from the side closer to the support substrate 1 is bonded to the upper surface of the support substrate 1 through solder (not shown). This p-side electrode 2 functions as a reflecting electrode. The p-side electrode 2 is an example of the "reflecting film" in the present invention.

A p-type contact layer 3 of p-type $Ga_{0.95}In_{0.05}N$ doped with Mg having a thickness of about 0.3 μm is formed on the p-side electrode 2. A p-type cladding layer 4 of p-type $Al_{0.05}Ga_{0.95}N$ doped with Mg having a thickness of about 5 nm is formed on the p-type contact layer 3. A p-type cap layer 5 of p-type $Al_{0.01}Ga_{0.9}N$ doped with Mg having a thickness of about 5 nm is formed on the p-type cladding layer 4. An active layer 6 having a single quantum well (SQW) structure is formed on the p-type cap layer 5. This active layer 6 includes a well layer of undoped $Ga_{0.8}In_{0.2}N$ having a thickness of about 5 nm. An n-type cladding layer 7 of n-type $Al_{0.1}Ga_{0.9}N$ doped with Si having a thickness of about 0.15 μm is formed on the active layer 6. An n-type contact layer 8 of n-type GaN doped with Si having a thickness of about 0.5 μm is formed on the n-type cladding layer 7. The p-type contact layer 4, the p-type cladding layer 4, the p-type cap layer 5, the active layer 6, the n-type cladding layer 7 and the n-type contact layer 8 constitute a nitride-based semiconductor element layer 9. The nitride-based semiconductor element layer 9 is an example of the "semiconductor element layer" in the present invention.

According to the first embodiment, the nitride-based semiconductor element layer 9 has side surfaces 9a inclined by a prescribed angle with respect to the normal of the light emission surface 11 in the vicinity of an end thereof. More specifically, the nitride-based semiconductor element layer 9 has the side surfaces 9a inclined by about 60°, to be tapered from the side of the support substrate 1 toward the side of the light emission surface 11. The inclined side surfaces 9a of the nitride-based semiconductor element layer 9 and the light emission surface 11 form an obtuse angle (about 120°).

An n-side electrode 10 is formed on a prescribed region of the n-type contact layer 8. This n-side electrode 10 is constituted of an ohmic electrode layer, a barrier metal layer and a pad metal layer successively from the side closer to the n-type contact layer 8. The ohmic electrode layer constituting the n-side electrode 10 is formed by an Al layer having a thickness of about 100 nm. The barrier metal layer constituting the n-side electrode 10 is formed by a Pt or Ti layer, having a thickness of about 100 nm, for suppressing reaction between the ohmic electrode layer and the pad metal layer. The pad metal layer constituting the n-side electrode 10 is formed by a layer of a fusible metal such as Au or Au—Sn having a thickness of about 500 nm. The n-side electrode 10 is arranged not on the overall surface but on the prescribed region of the n-type contact layer 8, in order to suppress reduction of the quantity of light emitted from the light emission surface 11.

According to the first embodiment, as hereinabove described, the support substrate 1 is set on the side opposite to the light emission surface 11 while the nitride-based semiconductor element layer 9 is bonded to the support substrate 1 so that light created in the nitride-based semiconductor element layer 9 (active layer 6) can be emitted from the light emission surface 11 opposite to the support substrate 1, whereby the light created in the active layer 6 can be emitted only through the nitride-based semiconductor element layer 9. Thus, no light is reflected on the interface between a growth substrate and the nitride-based semiconductor element layer 9 dissimilarly to a case of emitting light from a growth substrate employed for forming a conventional nitride-based semiconductor element layer, whereby light extraction efficiency can be inhibited from reduction. Further, the nitride-based semiconductor element layer 9 is formed to have the side surfaces 9$a$ inclined by about 60° to be tapered from the side of the support substrate 1 toward the side of the light emission surface 11, whereby light totally reflected on the light emission surface 11 is incident upon the side surfaces 9$a$ inclined with respect to the normal of the light emission surface 11 and the path of the light can be so changed that the angle of incidence of light with respect to the light emission surface 11 is smaller than the critical angle in consideration of the theory of geometrical optics. Consequently, the light totally reflected on the light emission surface 11 can also be emitted, whereby the light extraction efficiency can be improved. In addition, the nitride-based semiconductor element layer 9 is so tapered that the traveling direction of light can be changed due to a diffraction effect through the thickness of the nitride-based semiconductor element layer 9 reduced toward side end portions, whereby the quantity of light externally emitted from the nitride-based semiconductor element layer 9 can be increased. The light extraction effect can be improved also by this. Thus, the light extraction efficiency can be improved through the inclined side surfaces 9$a$ of the nitride-based semiconductor element layer 9 while inhibiting the light extraction efficiency from reduction resulting from reflection on the interface between the growth substrate and the nitride-based semiconductor element layer 9 according to the first embodiment.

According to the first embodiment, further, the inclined side surfaces 9$a$ of the nitride-based semiconductor element layer 9 and the light emission surface 11 so form an obtuse angle (about 120°) that the area of the surface of the nitride-based semiconductor element layer 9 closer to the support substrate 1 is larger than that of the surface closer to the light emission surface 11, whereby heat generated in the nitride-based semiconductor element layer 9 can be efficiently dissipated toward the support substrate 1. In addition, the inclined side surfaces 9$a$ of the nitride-based semiconductor element layer 9 and the light emission surface 11 so form an obtuse angle (about 120°) that the support substrate 1 and the nitride-based semiconductor element layer 9 form an acute angle (about 60°), whereby fused solder more hardly reaches the side surfaces 9$a$ of the nitride-based semiconductor element layer 9 over the p- and n-type layers when the support substrate 1 and the nitride-based semiconductor element layer 9 are bonded to each other through the solder as compared with a case where the support substrate 1 and the nitride-based semiconductor element layer 9 form an obtuse angle. Thus, the light-emitting device can be inhibited from a defective short resulting from solder reaching the side surfaces 9$a$ of the nitride-based semiconductor element layer 9. Further, the thickness (about 0.65 μm) of the portion of the nitride-based semiconductor element layer 9 located above the active layer 6 (closer to the light emission surface 11) is larger than the thickness (about 0.31 μm) of the portion located under the active layer 6 (closer to the support substrate 1) so that the active layer 6 can be arranged on the side closer to the support substrate 1 than the light emission surface 11, whereby the active layer 6 can be inhibited from size reduction despite the obtuse angle formed by the light emission surface 11 and the side surfaces 9$a$ of the nitride-based semiconductor element layer 9.

According to the first embodiment, the p-side electrode 2 functioning as a reflecting electrode is so provided between the support substrate 1 and the nitride-based semiconductor element layer 9 that light advancing toward the support substrate 1 can be reflected toward the light emission surface 11, whereby the light extraction efficiency can be further improved.

According to the first embodiment, the conductive support substrate 1 is so employed that the p- and n-side electrodes 2 and 10 can be oppositely arranged through the nitride-based semiconductor element layer 9. Thus, an emission area can be more increased as compared with a nitride-based semiconductor light-emitting device employing an insulating substrate having two electrodes arranged only on one side of a nitride-based semiconductor element layer, whereby the light extraction efficiency can be further improved.

According to the first embodiment, the nitride-based semiconductor element layer 9 (nitride-based semiconductor layers 3 to 8) is formed to have the side surfaces 9$a$ inclined by about 60° to be tapered from the side of the support substrate 1 toward the side of the light emission surface 11 so that the areas of the inclined side surfaces 9$a$ of the nitride-based semiconductor layer 9 are increased, whereby the quantity of light incident upon the inclined side surfaces 9$a$ of the nitride-based semiconductor layer 9 can be increased.

A manufacturing process for the nitride-based semiconductor light-emitting diode device according to the first embodiment is now described with reference to FIGS. 1 to 8.

Figure 2:
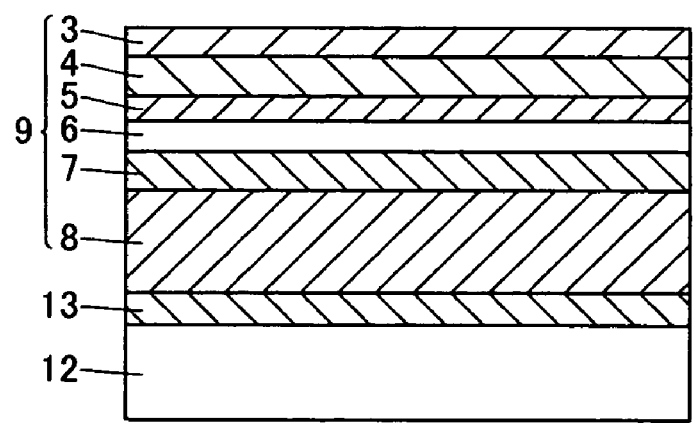
FIGS. 2 to 8 are sectional views for illustrating a manufacturing process for the nitride-based semiconductor light-emitting diode device according to the first embodiment shown in FIG. 1.

As shown in FIG. 2, a low-temperature buffer layer 13, the n-type contact layer 8, the n-type cladding layer 7, the active layer 6, the p-type cap layer 5, the p-type cladding layer 4 and the p-type contact layer 3 are successively grown on a sapphire substrate 12 employed as a growth substrate by metal organic chemical vapor deposition (MOCVD).

More specifically, the low-temperature buffer layer 13 of undoped non-single-crystalline GaN having a thickness of about 10 nm to about 50 nm is grown on the (0001) plane of the sapphire substrate 12 with source gas of $NH_3$ and trimethylgallium (TMGa) and dopant gas of $SiH_4$ while holding the sapphire substrate 12 at a growth temperature of about 400° C. to about 700° C. Alternatively, the low-temperature buffer layer 13 of n-type AlN may be grown with source gas of $NH_3$ and trimethylaluminum (TMAl), or the low-temperature buffer layer 13 of n-type AlGaN may be grown with source gas of $NH_3$, TMGa and TMAl.

Then, the n-type contact layer 8 of single-crystalline n-type GaN doped with Si having the thickness of about 0.5 µm is grown on the low-temperature buffer layer 13 at a growth rate of about 3 µm/h. with carrier gas of $H_2$ and $N_2$ ($H_2$ content: about 50%), source gas of $NH_3$ and TMGa and dopant gas of $SiH_4$ while holding the sapphire substrate 12 at a single crystal growth temperature of about 1000° C. to about 1200° C. (about 1150° C., for example). Thereafter the n-type cladding layer 7 of single-crystalline n-type $Al_{0.1}Ga_{0.9}N$ doped with Si having the thickness of about 0.15 µm is grown on the n-type contact layer 8 at a growth rate of about 3 µm/h. while changing the carrier gas and the source gas to that of $H_2$ and $N_2$ ($H_2$ content: about 1% to about 3%) and that of $NH_3$, TMGa and TMAl respectively.

Then, the well layer of undoped single-crystalline $Ga_{0.8}In_{0.2}N$ having the thickness of about 5 nm is grown on the n-type cladding layer 7 at a growth rate of about 0.4 nm/s. with carrier gas of $H_2$ and $N_2$ ($H_2$ content: about 1% to about 5%) and source gas of $NH_3$, TMGa and trimethylindium (TMIn) while holding the sapphire substrate 12 at a single crystal growth temperature of about 700° C. to about 1000° C., thereby growing the active layer 6 of the SQW structure including the well layer. Then, the p-type cap layer 5 of single-crystalline p-type $Al_{0.1}Ga_{0.9}N$ doped with Mg having the thickness of about 5 nm is grown a growth rate of about 0.4 nm/s. while changing the source gas to that of $NH_3$, TMGa and TMAl with addition of dopant gas of cyclopentadienylmagnesium ($Cp_2Mg$).

Then, the p-type cladding layer 4 of single-crystalline p-type $Al_{0.05}Ga_{0.95}N$ doped with Mg having the thickness of about 5 nm is grown on the p-type cap layer 5 at a growth rate of about 3 µm/h. with carrier gas of $H_2$ and $N_2$ ($H_2$ content: about 1% to about 3%), source gas of $NH_3$, TMGa and TMAl and dopant gas of $Cp_2Mg$ while holding the sapphire substrate 12 at a single crystal growth temperature of about 1000° C. to about 1200° C. (about 1150° C., for example). Then, a contact layer (not shown) of undoped single-crystalline $Ga_{0.95}In_{0.05}N$ having a thickness of about 0.3 µm is grown on the p-type cladding layer 4 at a growth rate of about 0.5 nm/s. while holding the sapphire substrate 12 at a single crystal growth temperature of about 700° C. to about 1200° C. (about 850° C., for example) and changing the source gas to that of $NH_3$, TMGa and TMAl without employing dopant gas.

Then, the sapphire substrate 12 is held at a temperature of about 400° C. to about 900° C. (about 800° C., for example) and annealed in an $N_2$ atmosphere, thereby reducing the hydrogen concentrations of the aforementioned nitride-based semiconductor layers to not more than about $5 \times 10^{18}$ $cm^{-3}$. Thereafter Mg of about $1 \times 10^{18}$ $cm^{-3}$ to about $1 \times 10^{19}$ $cm^{-3}$ is diffused in the contact layer with carrier gas of $N_2$ and dopant gas of $Cp_2Mg$, thereby converting the contact layer to the p-type contact layer 3 doped with Mg. Thus, the p-type contact layer 3, the p-type cladding layer 4, the p-type cap layer 5, the active layer 6, the n-type cladding layer 7 and the n-type contact layer 8 constitute the nitride-based semiconductor element layer 9. Thereafter the p-type contact layer 3, the p-type cladding layer 4 and the p-type cap layer 5 are converted to the p type by heat treatment or electron beam treatment.

Figure 3:
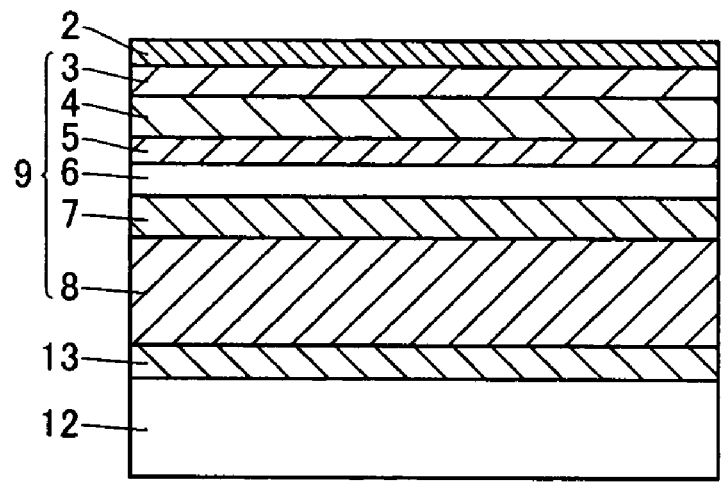

As shown in FIG. 3, the p-side electrode 2 composed of the Al layer and the Ag layer is formed on the p-type contact layer 3 by vacuum evaporation or the like. At this time, the Al layer having the thickness of about 5 nm is provided in the form of an island, and the Ag layer having the thickness of about 200 nm is thereafter formed to cover the overall surface thereof.

Figure 4:
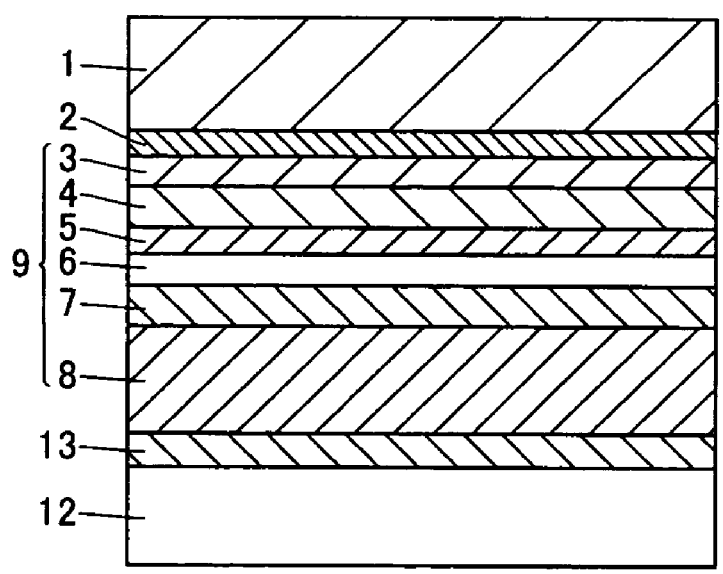

As shown in FIG. 4, the conductive support substrate 1 consisting of the semiconductor, the metal or the conductive resin film or the composite material of a metal and a metal oxide is bonded to the p-side electrode 2. At this time, the support substrate 1 may be bonded to the p-side electrode 2 through solder of Au—Sn or Pd—Sn or through conductive paste of Ag. Alternatively, the support substrate 1 may be directly pasted to the p-side electrode 2 and thereafter pressurized under a temperature condition of about 400° C. to about 1000° C., to be bonded to the p-side electrode 2.

Figure 5:
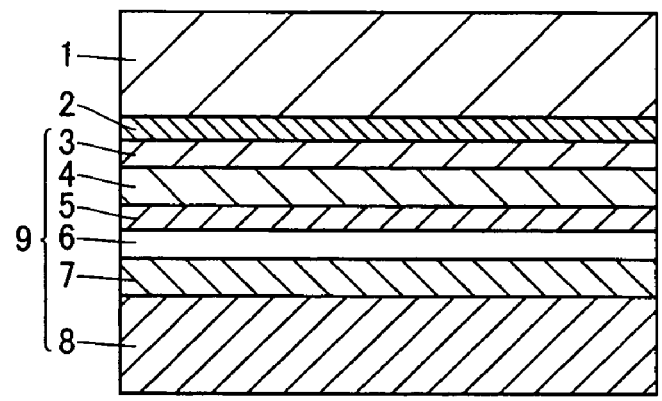

Thereafter the sapphire substrate 12 is removed by polishing or laser irradiation. Alternatively, the sapphire substrate 12 may be removed by dry or wet etching. Then, the low-temperature buffer layer 13 is removed by dry etching with $CF_4$ gas or the like or wet etching with a hot phosphoric acid solution or the like. Thus, the surface of the n-type contact layer 8 is exposed as shown in FIG. 5.

Figure 6:
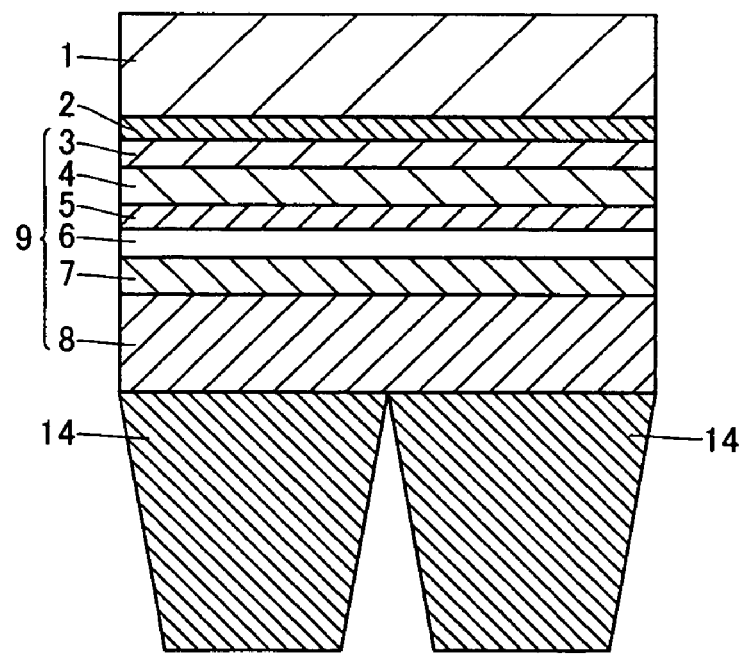

As shown in FIG. 6, a trapezoidal mask layer 14 of Al tapered oppositely to the n-type contact layer 8 is formed on the surface of the n-type contact layer 8. More specifically, an Al layer (not shown) having a thickness of about 2.5 µm is formed on the surface of the n-type contact layer 8 by electron beam evaporation. Thereafter the Al layer is processed by photolithography and etching to be tapered oppositely to the n-type contact layer 8, thereby forming the mask layer 14.

Figure 7:
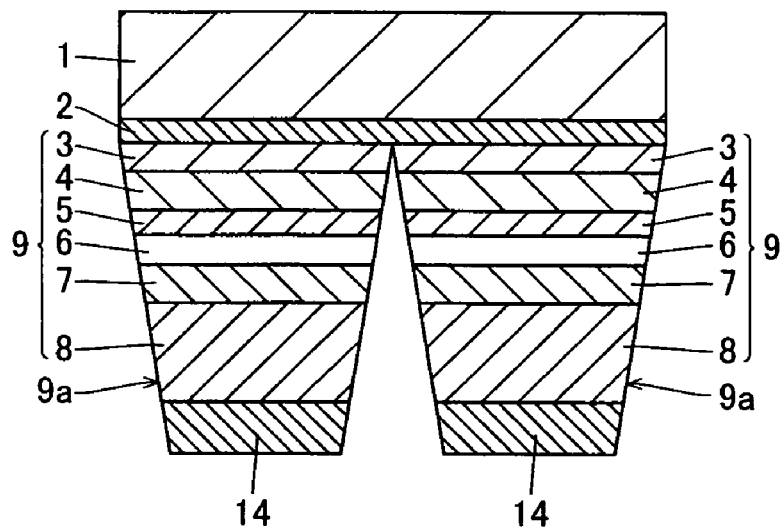

As shown in FIG. 7, the mask layer 14 and the nitride-based semiconductor element layer 9 are simultaneously etched through a parallel-plate-type dry etching apparatus until the etching depth reaches the surface of the p-side electrode 2. At this time, the discharge power and the discharge pressure are set to about 600 W and about $6 \times 10^2$ Pa to about 1.5 kPa respectively, and etching gas of $CF_4$ is employed. The etching rates for the mask layer 14 and the nitride-based semiconductor element layer 9 can be substantially equalized with each other under these etching conditions, whereby the nitride-based semiconductor element layer 9 has a shape reflecting that of the mask layer 14. In other words, the nitride-based semiconductor layer 9 is formed to have the side surfaces 9a inclined by the prescribed angle with respect to the normal of the light emission surface 11 (see FIG. 1). More specifically, the nitride-based semiconductor element layer 9 is tapered from the side of the support substrate 1 toward the side of the n-type contact layer 8, while the inclined side surfaces 9a of the nitride-based semiconductor element layer 9 and the surface of the n-type contact layer 8 form an obtuse angle. Thereafter the mask layer 14 is removed through dilute hydrochloric acid.

Figure 8:
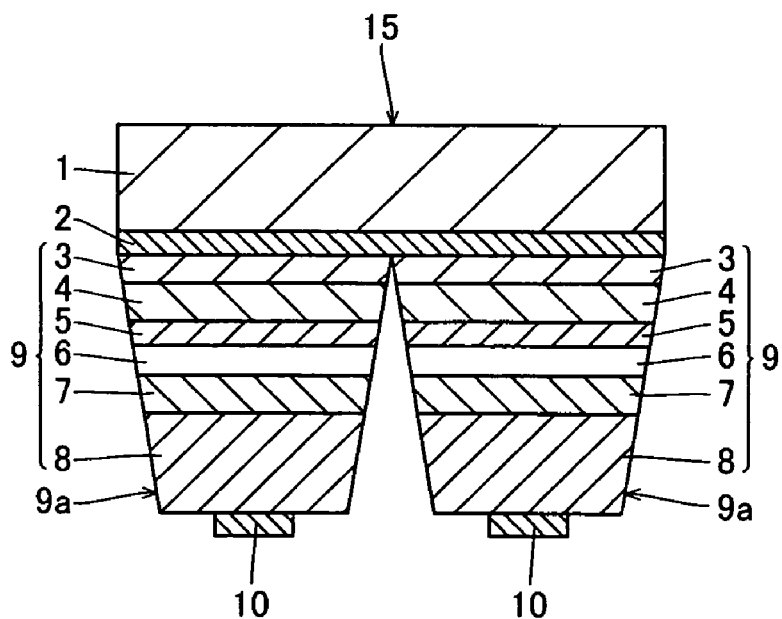

As shown in FIG. 8, the n-side electrode 10 is formed on the prescribed region of the surface of the n-type contact layer 8 by vacuum evaporation or the like. At this time, the ohmic electrode layer, the barrier metal layer and the pad metal layer are formed successively from the side closer to the n-type contact layer 8. The ohmic electrode layer constituting the n-side electrode 10 is formed by the Al layer having the thickness of about 100 nm. The barrier metal layer constituting the n-side electrode 10 is formed by the Pt or Ti layer having the thickness of about 100 nm. The pad metal layer constituting the n-side electrode 10 is formed by the Au or Au—Sn layer having the thickness of about 500 nm.

Thereafter the device is separated from an adjacent device along an element isolation region 15. At this time, the element isolation region 15 may be notched by dicing, for isolating the device from the adjacent device along the notch. Alternatively, the element isolation region 15 may be notched by etching, for isolating the device from the adjacent device along the notch. Further alternatively, the element isolation region 15 of the support substrate 1 may be notched by dicing while notching the element isolation region 15 of the nitride-based semiconductor element layer 9 by etching, for isolating the device from the adjacent device along the notches formed by dicing and etching respectively. When dicing and etching are combined with each other as described above, no cutter comes into contact with the nitride-based semiconductor element layer 9, whereby damage on the nitride-based semiconductor element layer 9 is reduced. Thus, the nitride-based semiconductor light-emitting diode device according to the first embodiment is formed as shown in FIG. 1.

Second Embodiment

Figure 9:
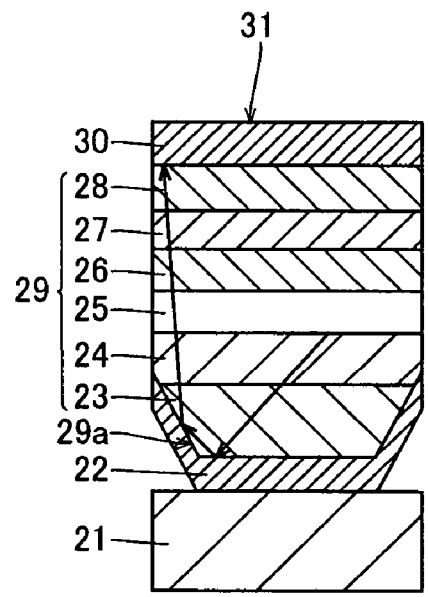
FIG. 9 is a sectional view showing the structure of a nitride-based semiconductor light-emitting diode device according to a second embodiment of the present invention.

Referring to FIG. 9, inclined side surfaces 29a of a nitride-based semiconductor element layer 29 and a light emission surface 31 form an acute angle while lateral reflecting films are provided on the inclined side surfaces 29a of the nitride-based semiconductor element layer 29 in a nitride-based semiconductor light-emitting diode device according to a second embodiment of the present invention, dissimilarly to the aforementioned first embodiment. Referring to FIG. 9, arrows denote paths of light.

In the nitride-based semiconductor light-emitting diode device according to the second embodiment, an n-side electrode 22 of Al having a thickness of about 2 nm is formed on a conductive support substrate 21 set on a side opposite to the light emission surface 31, as shown in FIG. 9. The n-side electrode 22 is an example of the "reflecting film" in the present invention.

An n-type contact layer 23 of n-type GaN doped with Si having a thickness of about 0.5 μm is formed on the n-side electrode 22. An n-type cladding layer 24 of n-type $Al_{0.1}Ga_{0.9}N$ doped with Si having a thickness of about 0.1 μm is formed on the n-type contact layer 23. An active layer 25 having a multiple quantum well (MQW) structure is formed on the n-type cladding layer 24. The active layer 25 has the MQW structure obtained by alternately stacking three well layers (not shown) of undoped $Ga_{0.95}In_{0.05}N$ each having a thickness of about 3 nm and two barrier layers (not shown) of $Al_{0.05}Ga_{0.95}In$ each having a thickness of about 15 nm. A p-type cap layer 26 of p-type $Al_{0.15}Ga_{0.85}N$ doped with Mg having a thickness of about 5 nm is formed on the active layer 25. A p-type cladding layer 27 of p-type $Al_{0.1}Ga_{0.9}N$ doped with Mg having a thickness of about 0.1 μm is formed on the p-type cap layer 26. A p-type contact layer 28 of p-type GaN doped with Mg having a thickness of about 0.05 μm is formed on the p-type cladding layer 27. The n-type contact layer 23, the n-type cladding layer 24, the active layer 25, the p-type cap layer 26, the p-type cladding layer 27 and the p-type contact layer 28 constitute the nitride-based semiconductor element layer 29. The nitride-based semiconductor element layer 29 is an example of the "semiconductor element layer" in the present invention.

According to the second embodiment, the forward end of the nitride-based semiconductor element layer 29 closer to the n-type contact layer 23 has the side surfaces 29a inclined by a prescribed angle with respect to the normal of the light emission surface 31. More specifically, the forward end of the nitride-based semiconductor element layer 29 closer to the n-type contact layer 23 has the side surfaces 29a inclined by about 45°, to be tapered from the side of the light emission surface 31 toward the side of the support substrate 21. Further, the side surfaces of the n-type contact layer 23 and the n-type cladding layer 24 are partially inclined. In addition, the inclined side surfaces 29a of the nitride-based semiconductor element layer 29 and the light emission surface 31 form an acute angle (about 45°). According to the second embodiment, the n-side electrode 22 is formed to extend along the inclined side surfaces 29a of the nitride-based semiconductor element layer 29. Portions of the n-side electrode 22 located on the inclined side surfaces 29a of the nitride-based semiconductor element layer 29 are examples of the "lateral reflecting film" in the present invention.

A p-side electrode 30 is formed on the p-type contact layer 28. The p-side electrode 30 is constituted of a transparent electrode obtained by forming an Ni layer having a thickness of about 5 nm and an Au layer having a thickness of about 5 nm successively from the side closer to the p-type contact layer 28.

According to the second embodiment, as hereinabove described, the side surfaces 29a of the nitride-based semiconductor element layer 29 are inclined by about 45° so that the forward end of the nitride-based semiconductor element layer 29 closer to the n-type contact layer 23 is tapered from the side of the light emission surface 31 toward the side of the support substrate 21, whereby the path of light can be changed and a diffraction effect can be increased so that the angle of incidence of light upon the light emission surface 31 is smaller than the critical angle similarly to the case of forming the nitride-based semiconductor element layer 9 with the side surfaces 9a inclined by about 60° to be tapered from the side of the support substrate 1 toward the side of the light emission surface 11 in the aforementioned first embodiment. According to the second embodiment, further, the support substrate 21 is so set on the side opposite to the light emission surface 31 that light created in the nitride-based semiconductor element layer 29 (active layer 25) can be emitted from the light emission surface 31 opposite to the support substrate 21 similarly to the aforementioned first embodiment, whereby the light created in the active layer 25 can be emitted only through the nitride-based semiconductor element layer 29. Consequently, the light extraction efficiency can be improved through the inclined side surfaces 29a of the nitride-based semiconductor element layer 29 while inhibiting the light extraction efficiency from reduction resulting from reflection on the interface between a growth substrate and the nitride-based semiconductor element layer 29, similarly to the aforementioned first embodiment.

According to the second embodiment, in addition, the n-side electrode 22 is formed also on the inclined side surfaces 29a of the nitride-based semiconductor element layer 29 so that the quantity of light reflected on the inclined side surfaces 29a of the nitride-based semiconductor element layer 29 can be increased, whereby the light extraction efficiency can be further improved.

The remaining effects of the second embodiment are similar to those of the aforementioned first embodiment.

A manufacturing process for the nitride-based semiconductor light-emitting device according to the second embodiment is now described with reference to FIGS. 9 to 18.

Figure 10:
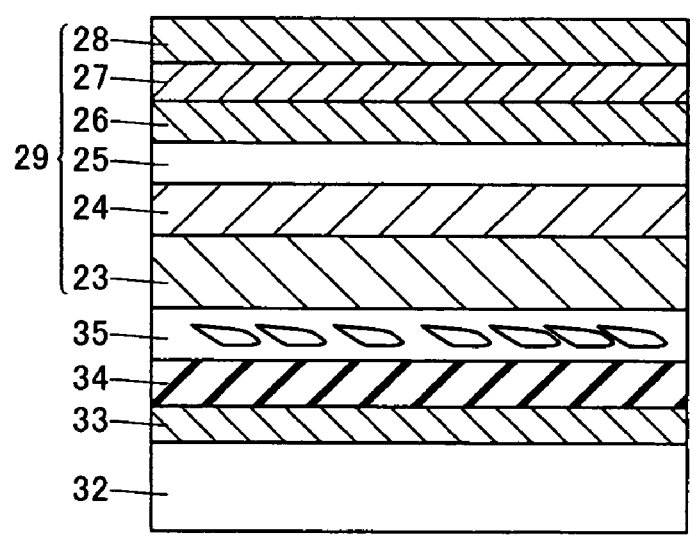
FIGS. 10 to 18 are sectional views for illustrating a manufacturing process for the nitride-based semiconductor light-emitting diode device according to the second embodiment shown in FIG. 9.

As shown in FIG. 10, a buffer layer 33 of AlGaN or GaN having a thickness of about 10 nm to about 50 nm is grown on the (0001) plane of a 6H—SiC substrate 32 employed as a growth substrate by MOCVD. Thereafter an undoped GaN layer 34 having a thickness of about 0.5 μm is grown on the buffer layer 33.

Then, an isolation layer (gap layer) 35 is formed on the GaN layer 34. More specifically, A Ti layer (not shown) having a thickness of about 10 nm to about 200 nm is formed on the GaN layer 34 by vacuum evaporation and thereafter heat-treated in an ammonia atmosphere under a temperature condition of about 150° C. Thus, the Ti layer is nitrided to form the isolation layer 35 of TiN having a meshy section. This isolation layer 35 having a meshy section includes gaps therein and partially exposes the GaN layer 34. FIG. 10 illustrates the gaps in the isolation layer 35.

Then, the n-type contact layer 23 of n-type GaN doped with Si having the thickness of about 0.5 μm is grown on the isolation layer 35 by MOCVD. At this time, the n-type contact layer 23 is selectively vertically grown on the exposed surface of the GaN layer 34 and thereafter gradually laterally grown. Therefore, dislocations formed on the n-type contact layer 23 are laterally bent to hardly form vertically propagated dislocations. Thus, the dislocation density of the n-type contact layer 23 can be remarkably reduced as compared with that of the GaN layer 34.

Then, the n-type cladding layer 24 of n-type $Al_{0.1}Ga_{0.9}N$ doped with Si having the thickness of about 0.1 μm is grown on the n-type contact layer 23. Thereafter the three well layers (not shown) of undoped $Ga_{0.95}In_{0.05}N$ each having the thickness of about 3 nm and the two barrier layers (not shown) of $Al_{0.05}Ga_{0.95}In$ each having the thickness of about 15 nm are alternately grown thereby growing the active layer 25 having the MQW structure obtained by alternately stacking the three well layers and the two barrier layers.

Then, the p-type cap layer 26 of p-type $Al_{0.15}Ga_{0.85}N$ doped with Mg having the thickness of about 5 nm is grown on the active layer 25. Then, the p-type cladding layer 27 of p-type $Al_{0.1}Ga_{0.9}N$ doped with Mg having the thickness of about 0.1 μm and the p-type contact layer 28 of p-type GaN doped with Mg having the thickness of about 0.05 μm are successively grown on the p-type cap layer 26. Thus, the n-type contact layer 23, the n-type cladding layer 24, the active layer 25, the p-type cap leery 26, the p-type cladding layer 27 and the p-type contact layer 28 constitute the nitride-based semiconductor element layer 29. Thereafter the p-type contact layer 28, the p-type cladding layer 27 and the p-type cap layer 26 are converted to the p type by heat treatment or electron beam treatment.

Figure 11:
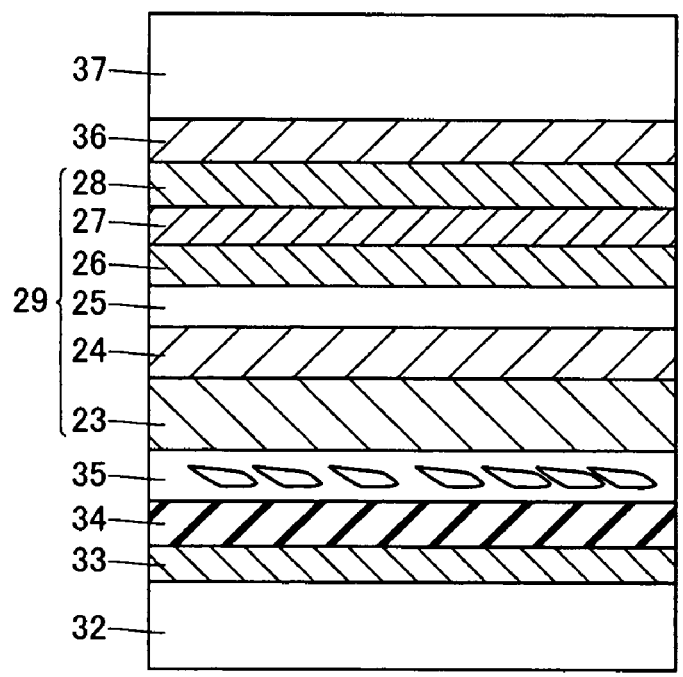
Figure 12:
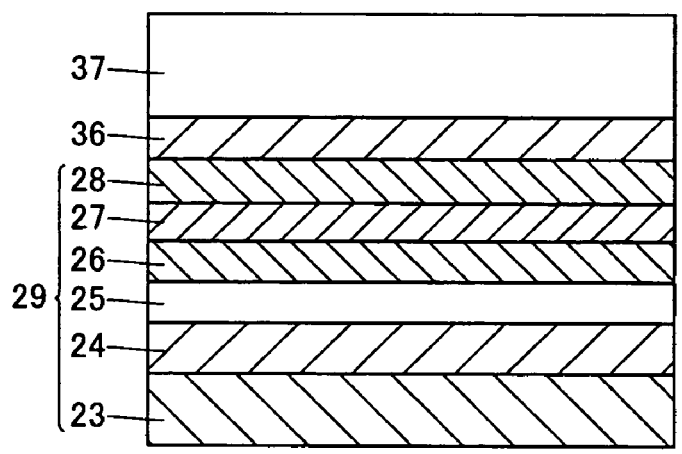

As shown in FIG. 11, a sapphire substrate 37 employed as a temporary substrate is bonded to the p-type contact layer 28 through a fusion layer 36 of a metal such as In—Sn having a low melting point. Thereafter the nitride-based semiconductor element layer 29 located on the isolation layer 35 is isolated from the layers 32 to 34 located under the isolation layer 35. At this time, the isolation layer 35 may be removed by wet etching with a mixture of an HF solution and an $HNO_3$ solution, or by externally applying physical force. Alternatively, the nitride-based semiconductor element layer 29 located on the isolation layer 35 and the layers 32 to 34 located under the isolation layer 35 may be pulled oppositely to each other, to be isolated from each other. Thus, the surface of the n-type contact layer 23 is exposed as shown in FIG. 12.

Figure 13:
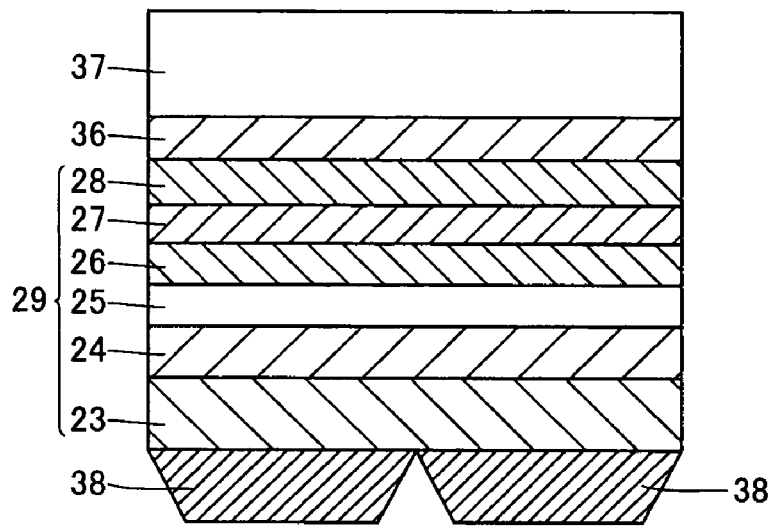

As shown in FIG. 13, a trapezoidal mask layer 38 of Al tapered oppositely to the n-type contact layer 23 is formed on the surface of the n-type contact layer 23 through a process similar to that of the first embodiment shown in FIG. 6.

Figure 14:
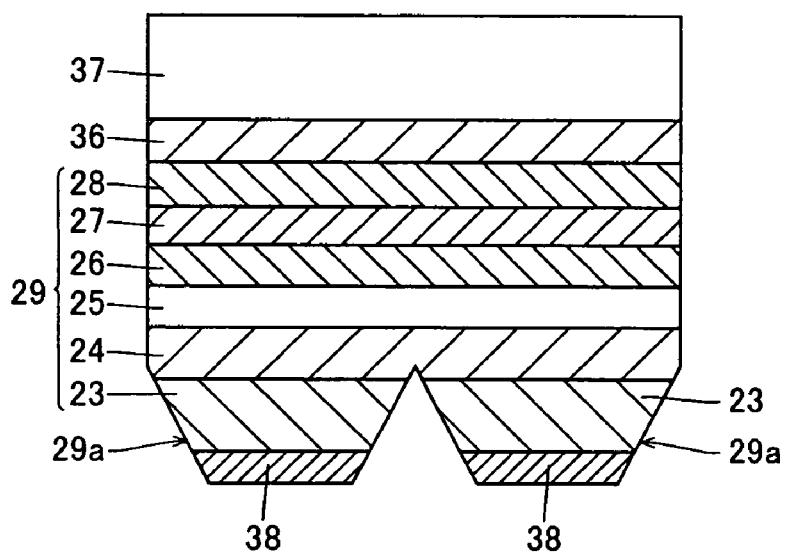

As shown in FIG. 14, the mask layer 38 and the nitride-based semiconductor element layer 29 are simultaneously etched until the etching depth reaches an intermediate portion of the n-type cladding layer 24 through a process similar to that of the first embodiment shown in FIG. 7. Thus, the shape of the forward end of the nitride-based semiconductor element layer 29 closer to the n-type contact layer 23 reflects that of the mask layer 38. In other words, the forward end of the nitride-based semiconductor element layer 29 closer to the n-type contact layer 23 has the side surfaces 29a inclined by the prescribed angle with respect to the normal of the light emission surface 31 (see FIG. 9). More specifically, the forward end of the nitride-based semiconductor element layer 29 closer to the n-type contact layer 23 is tapered from the side of the sapphire substrate 37 toward the side of the n-type contact layer 23, while the inclined side surfaces 29a of the nitride-based semiconductor element layer 29 and the light emission surface 31 form an acute angle. Thereafter the mask layer 38 is removed through dilute hydrochloric acid.

Figure 15:
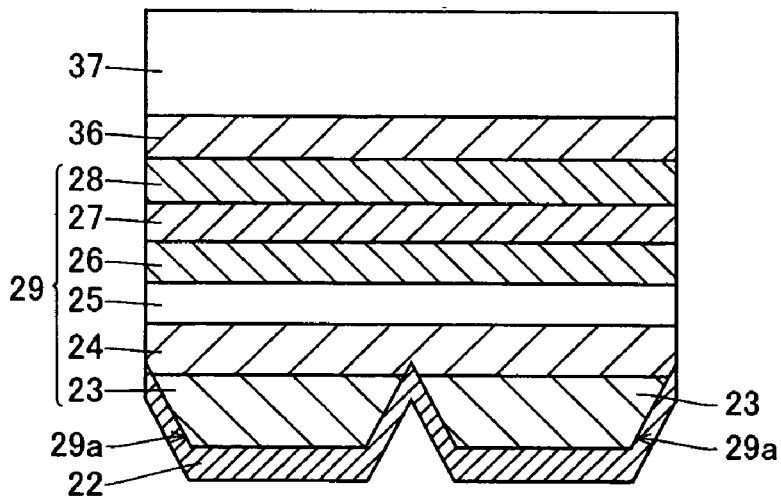

As shown in FIG. 15, the n-side electrode 22 of Al having the thickness of about 2 nm is formed to cover the surface of the n-type contact layer 23 and the inclined side surfaces 29a of the nitride-based semiconductor element layer 29 by vacuum evaporation or the like.

Figure 16:
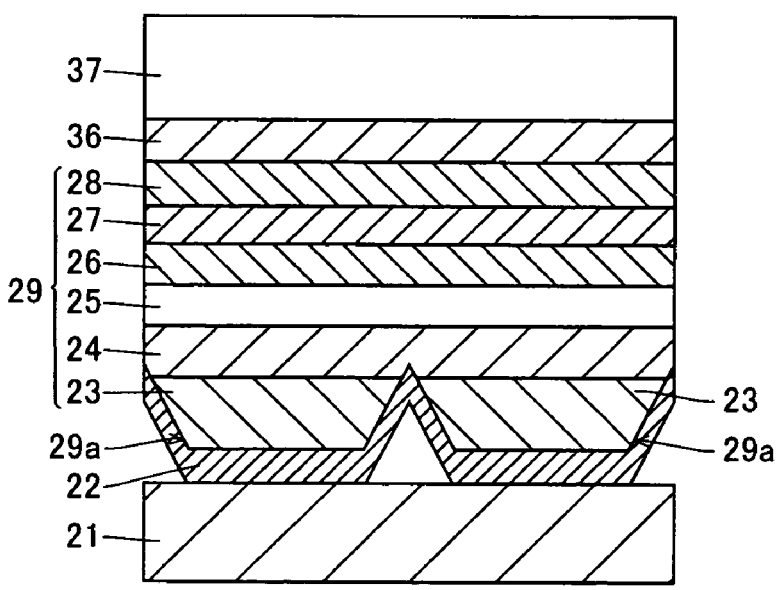
Figure 17:
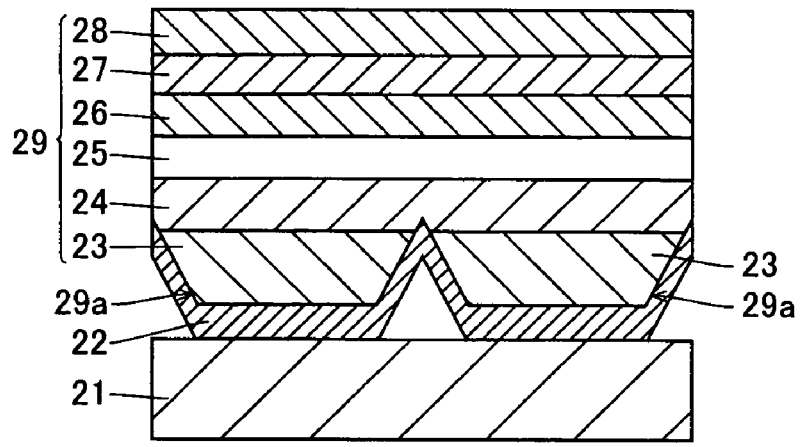

As shown in FIG. 16, the conductive support substrate 21 is bonded to the n-side electrode 22 through a process similar to that of the first embodiment shown in FIG. 4. Thereafter the sapphire substrate 37 and the fusion layer 36 are successively removed. Thus, the surface of the p-type contact layer 28 is exposed as shown in FIG. 17.

Figure 18:
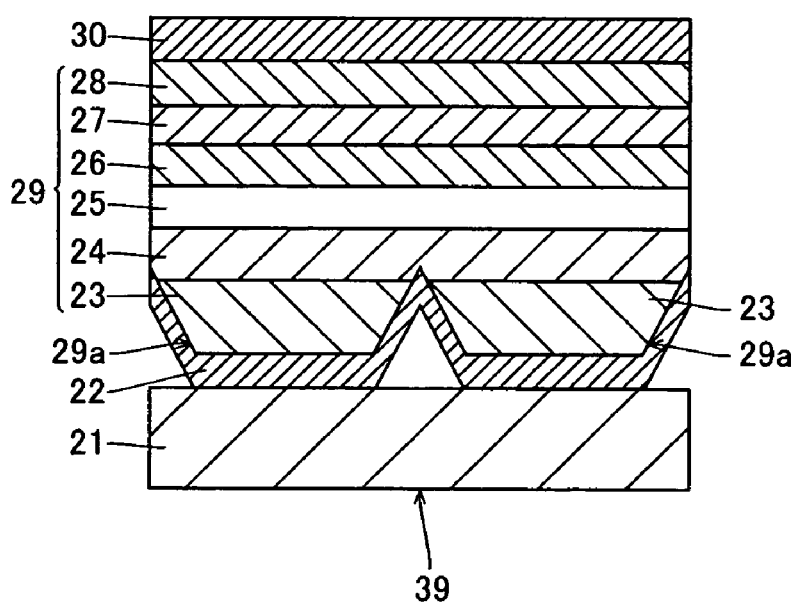

As shown in FIG. 18, the p-side electrode 30 is formed on the p-type contact layer 28 by vacuum evaporation or the like. At this time, the Ni layer having the thickness of about 5 nm and the Au layer having the thickness of about 5 nm are formed successively from the side closer to the p-type contact layer 28.

Thereafter the device is separated from an adjacent device along an element isolation region 39 through a process similar to that of the first embodiment shown in FIG. 8. A space is provided between the side surface 29a of the nitride-based semiconductor element layer 29 closer to the adjacent device and the corresponding side surface of a nitride-based semiconductor element layer of the device adjacent to the nitride-based semiconductor light-emitting diode device through the element isolation region 39. When the support substrate 21 is notched by dicing, therefore, a cutter can be inhibited from coming into contact with the nitride-based semiconductor element layer 29, whereby damage on the nitride-based semiconductor element layer 29 can be reduced. Thus, the nitride-based semiconductor light-emitting diode device according to the second embodiment is formed as shown in FIG. 9.

Third Embodiment

Figure 19:
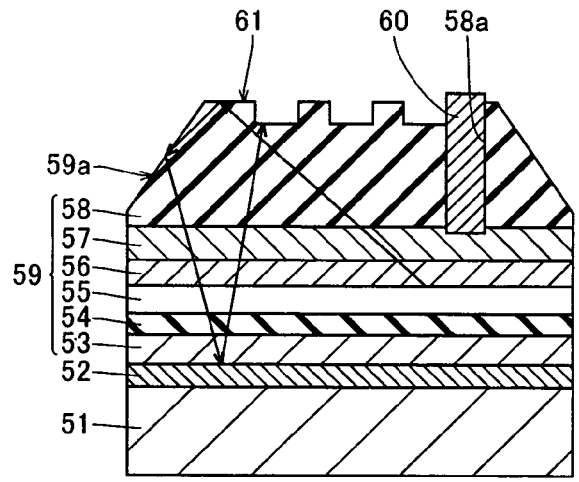
FIG. 19 is a sectional view showing the structure of a nitride-based semiconductor light-emitting diode device according to a third embodiment of the present invention.

Referring to FIG. 19, inclined side surfaces 59a of a nitride-based semiconductor element layer 59 and a light emission surface 61 form an obtuse angle while the light emission surface 61 is corrugated in a nitride-based semiconductor light-emitting diode device according to a third embodiment of the present invention, dissimilarly to the aforementioned first and second embodiments.

In the nitride-based semiconductor light-emitting diode device according to the third embodiment, a p-side electrode 52 having a composition and a thickness similar to those of the p-side electrode 2 in the aforementioned first embodiment is bonded to a conductive support substrate 51 set on a side opposite to the light emission surface 61, as shown in FIG. 19. The p-side electrode 52 is an example of the "reflecting film" in the present invention.

A p-type contact layer 53 of p-type GaN doped with Mg having a thickness of about 0.2 μm is formed on the p-side electrode 52. This p-type contact layer 53 functions also as a cladding layer. A cap layer 54 of undoped $Al_{0.05}Ga_{0.95}N$ having a thickness of about 5 nm is formed on the p-type contact layer 53. An active layer 55 having an MQW structure is formed on the cap layer 54. The active layer 55 has the MQW structure obtained by alternately stacking four barrier layers (not shown) of undoped GaN each having a thickness of about 10 nm and three well layers (not shown) of undoped $Ga_{0.85}In_{0.15}N$ each having a thickness of about 3 nm. An n-type cladding layer 56 of n-type $Al_{0.05}Ga_{0.95}N$ doped with Ge having a thickness of about 0.05 μm is formed on the active layer 55. An n-type contact layer 57 of n-type GaN doped with Ge having a thickness of about 0.5 μm is formed on the n-type cladding layer 66. A light transmission layer 58 of undoped GaN having a thickness of about 2 μm is formed on the n-type contact layer 57. This light transmission layer 58 has an opening 58a. The p-type contact layer 53, the cap layer 54, the active layer 55, the n-type cladding layer 56, the n-type contact layer 57 and the light transmission layer 58 constitute the nitride-based semiconductor element layer 59. The nitride-based semiconductor element layer 59 is an example of the "semiconductor element layer" in the present invention.

According to the third embodiment, the forward end of the nitride-based semiconductor element layer 59 closer to the light transmission layer 58 has the side surfaces 59a inclined by a prescribed angle with respect to the normal of the light emission surface 61. More specifically, the forward end of the nitride-based semiconductor element layer 59 closer to the light transmission layer 58 has the side surfaces 59 inclined by about 45°, to be tapered from the side of the support substrate 51 toward the side of the light emission surface 61. Further, the side surfaces of the light transmission layer 58 are partially inclined by about 45°. In addition, the inclined side surfaces 59a of the nitride-based semiconductor element layer 59 and the light emission surface 61 form an obtuse angle (about 135°). According to the third embodiment, the surface of the light transmission layer 58 forming the light emission surface 61 is corrugated.

An n-side electrode 60 having a composition and a thickness similar to those of the n-side electrode 10 in the aforementioned first embodiment is formed in the opening 58a of the light transmission layer 58, to be in contact with the surface of the n-type contact layer 57.

According to the third embodiment, as hereinabove described, the side surfaces 59a of the nitride-based semiconductor element layer 59 are inclined by about 45° so that the forward end of the nitride-based semiconductor element layer 59 closer to the light transmission layer 58 is tapered from the side of the support substrate 51 toward the side of the light emission surface 61, whereby the path of light can be changed and a diffraction effect can be increased so that the angle of incidence of light upon the light emission surface 61 is smaller than the critical angle, similarly to the aforementioned first and second embodiments. According to the third embodiment, further, the support substrate 51 is so set on the side opposite to the light emission surface 61 that light created in the nitride-based semiconductor element layer 59 (active layer 55) can be emitted from the light emission surface 61 opposite to the support substrate 51 similarly to the aforementioned first and second embodiments, whereby the light created in the active layer 55 can be emitted only through the nitride-based semiconductor element layer 59. Consequently, the light extraction efficiency can be improved through the inclined side surfaces 59a of the semiconductor element layer 59 while inhibiting the light extraction efficiency from reduction resulting from reflection on the interface between a growth substrate and the nitride-based semiconductor element layer 59, similarly to the aforementioned first and second embodiments.

According to the third embodiment, further, the light transmission layer 58 of undoped GaN is so formed on the n-type contact layer 57 of n-type GaN that the light transmission layer 58 formed with no impurity levels resulting from impurity doping can be more inhibited from light absorption resulting from impurity levels as compared with the n-type contact layer 57 and the n-type cladding layer 56. Thus, light totally reflected on the light emission surface 61 (surface of the light transmission layer 58) passes through the light transmission layer 58 having smaller light absorption as compared with the n-type contact layer 57 and the n-type cladding layer 56. Therefore, the probability of light absorption can be more reduced as compared with a case where light totally reflected on the light emission surface 61 passes through only the n-type contact layer 57 and the n-type cladding layer 56 easily causing light absorption resulting from impurity levels. Consequently, the light totally reflected on the light emission surface 61 can be inhibited from absorption, whereby the light extraction efficiency can be further improved.

According to the third embodiment, in addition, the light emission surface 61 (surface of the light transmission layer 58) is corrugated to be inhibited from totally reflecting light, whereby the light extraction efficiency can be further improved.

The remaining effects of the third embodiment are similar to those of the aforementioned first embodiment.

A manufacturing process for the nitride-based semiconductor light-emitting diode device according to the third embodiment is now described with reference to FIGS. 19 to 26.

Figure 20:
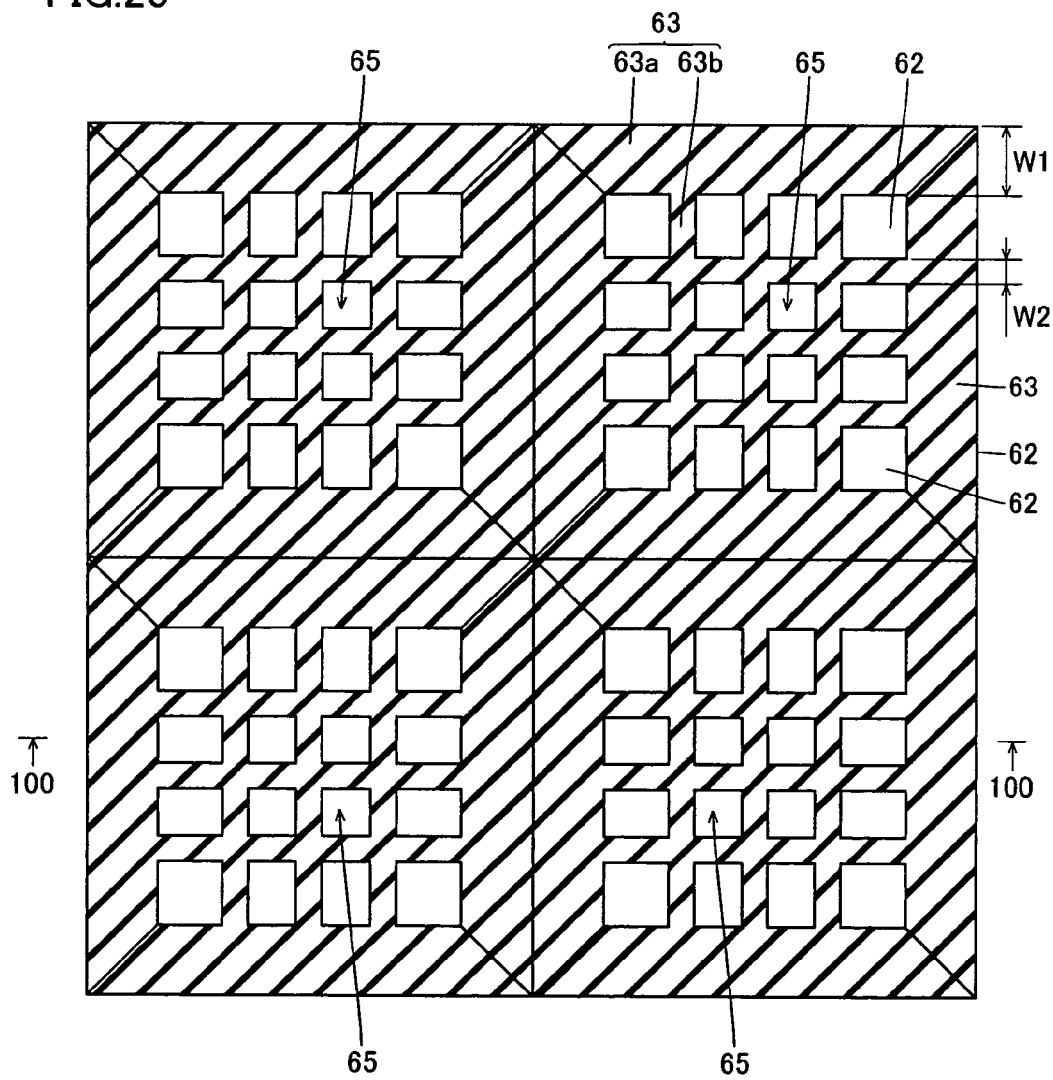
FIG. 20 is a plan view for illustrating a manufacturing process for the nitride-based semiconductor light-emitting diode device according to the third embodiment shown in FIG. 19.
Figure 21:
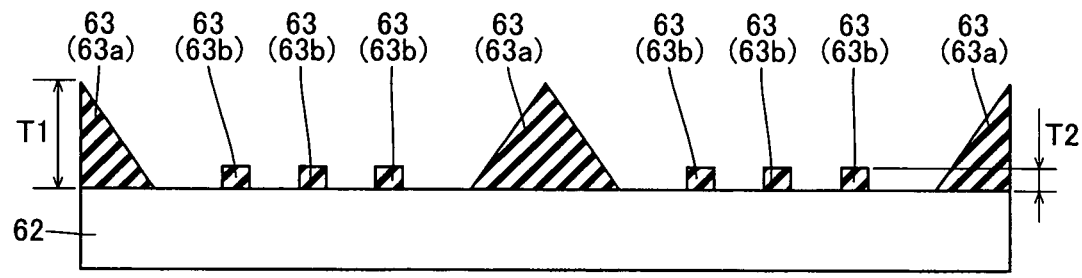
FIG. 21 is a sectional view taken along the line 100-100 in FIG. 20.

As shown in FIG. 20 (plan view) and FIG. 21 (sectional view taken along the line 100-100 in FIG. 20), a mask layer 63 of SiN is formed on a prescribed region of an Si substrate 62 employed as a growth substrate by CVD. More specifically, the mask layer 63 is formed to include a portion 63a enclosing a region 65 for forming each device and a latticed portion 63b enclosed with the portion 63a in plan view, as shown in FIG. 20. The region 65 for forming each device is a quadratic region about 500 μm square. The widths W1 and W2 of the portions 63a and 63b of the mask layer 63 are set to about 1.8 μm and about 0.6 μm respectively. Further, the side surfaces of the portion 63a of the mask layer 63 are inclined by a prescribed angle, as shown in FIG. 21. The height T1 of the portion 63a is set to about 1.8 μm, while the height (thickness) of the portion 63b is set to about 0.4 μm.

Figure 22:
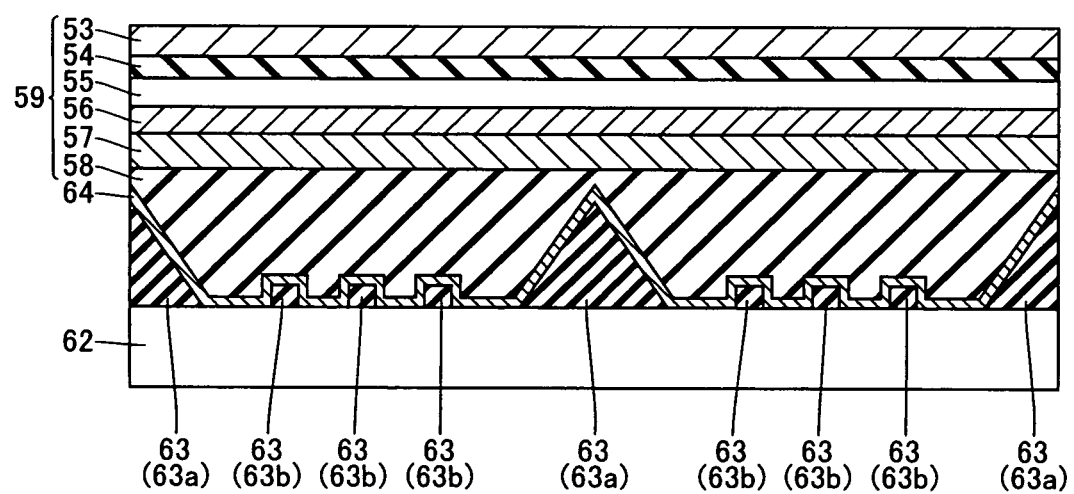
FIGS. 22 to 26 are sectional views for illustrating the manufacturing process for the nitride-based semiconductor light-emitting diode device according to the third embodiment shown in FIG. 19.

As shown in FIG. 22, a buffer layer 64 of AlN having a thickness of about 10 nm to about 50 nm is grown on the SiC substrate 62 by MOCVD, to cover the mask layer 63. Thereafter the light transmission layer 58 of undoped GaN having the thickness of about 2 μm is grown on the buffer layer 64. At this time, the light transmission layer 58 is selectively vertically grown on a portion of the buffer layer 64 located on a region other than that formed with the mask layer 63 and thereafter gradually laterally grown to have a flat surface. Therefore, dislocations formed on the light transmission layer 58 are laterally bent to hardly form vertically propagated dislocations. Thus, the dislocation density of the light transmission layer 85 can be remarkably reduced.

Then, the n-type contact layer 57 of n-type GaN doped with Ge having the thickness of about 0.5 μm and the n-type cladding layer 56 of n-type $Al_{0.05}Ga_{0.95}N$ doped with Ge having the thickness of about 0.05 μm are successively grown on the light transmission layer 58. Thereafter the four barrier layers (not shown) of undoped GaN each having the thickness of about 10 nm and the three well layers (not shown) of undoped $Ga_{0.85}In_{0.15}N$ each having the thickness of about 3 nm are alternatively grown for growing the active layer 55 having the MQW structure obtained by alternately stacking the four barrier layers and the three well layers.

Then, the cap layer 54 of undoped $Al_{0.05}Ga_{0.95}N$ having the thickness of about 5 nm and the p-type contact layer 53 of p-type GaN doped with Mg having the thickness of about 0.2 μm are successively grown on the active layer 55. Thus, the p-type contact layer 53, the cap layer 54, the active layer 55, the n-type cladding layer 56, the n-type contact layer 57 and the light transmission layer 58 constitute the nitride-based semiconductor element layer 59. Thereafter the p-type contact layer 53 is converted to the p type by heat treatment or electron beam treatment.

Figure 23:
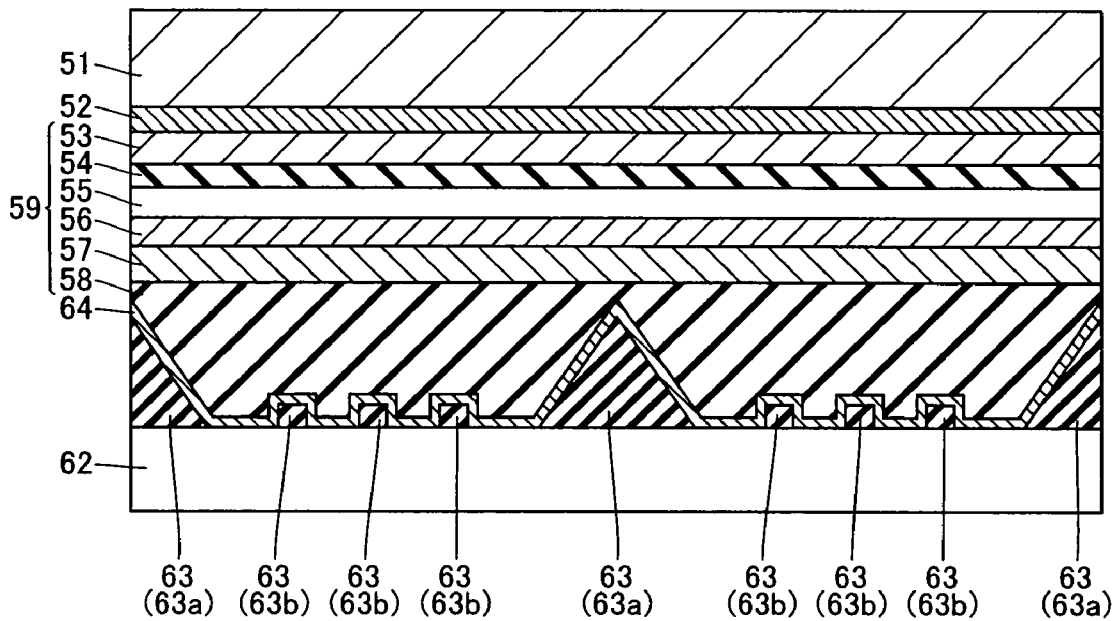
Figure 24:
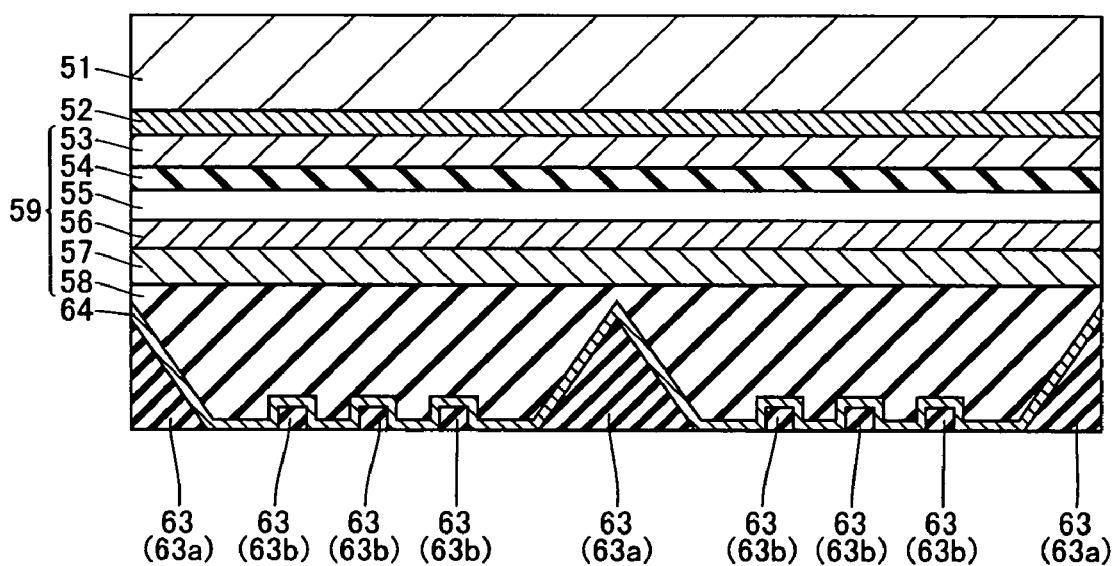

As shown in FIG. 23, the p-side electrode 52 having the composition and the thickness similar to those of the p-side electrode 2 in the aforementioned first embodiment is formed on the p-type contact layer 53 by vacuum evaporation or the like, and the conductive support substrate 51 is thereafter bonded to the p-side electrode 52 through a process similar to that of the first embodiment shown in FIG. 4. Thereafter the Si substrate 62 is removed by wet etching. Thus, the mask layer 63 and the buffer layer 64 are exposed as shown in FIG. 24.

Figure 25:
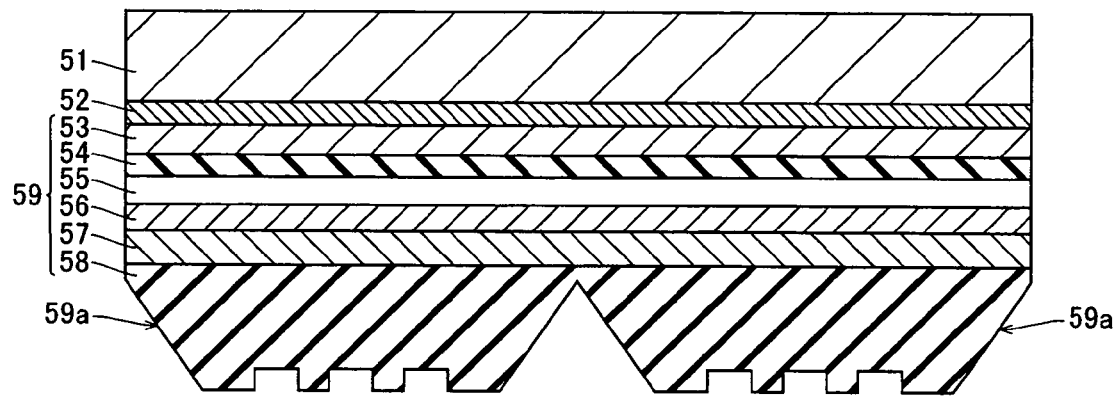

Then, the mask layer 63 and the buffer layer 64 are removed by etching, thereby exposing the light transmission layer 58 as shown in FIG. 25. Thus, the shape of the light transmission layer 58 reflects those of the portions 63a and 63b (see FIGS. 20 and 21) of the mask layer 63. In other words, the forward end of the nitride-based semiconductor layer 59 closer to the light transmission layer 58 is formed to have the side surfaces 59a inclined by the prescribed angle with respect to the normal of the light emission surface 61 (see FIG. 19). More specifically, the forward end of the nitride-based semiconductor element layer 59 closer to the light transmission layer 58 is tapered from the side of the support substrate 51 toward the side of the light transmission layer 58, while the inclined side surfaces 59a of the nitride-based semiconductor element layer 59 and the surface of the light layer 58 form an obtuse angle. Further, the surface of the light transmission layer 58 constituting the nitride-based semiconductor element layer 59 is corrugated in reflection of the shape of the latticed portion 63b of the mask layer 63.

Figure 26:
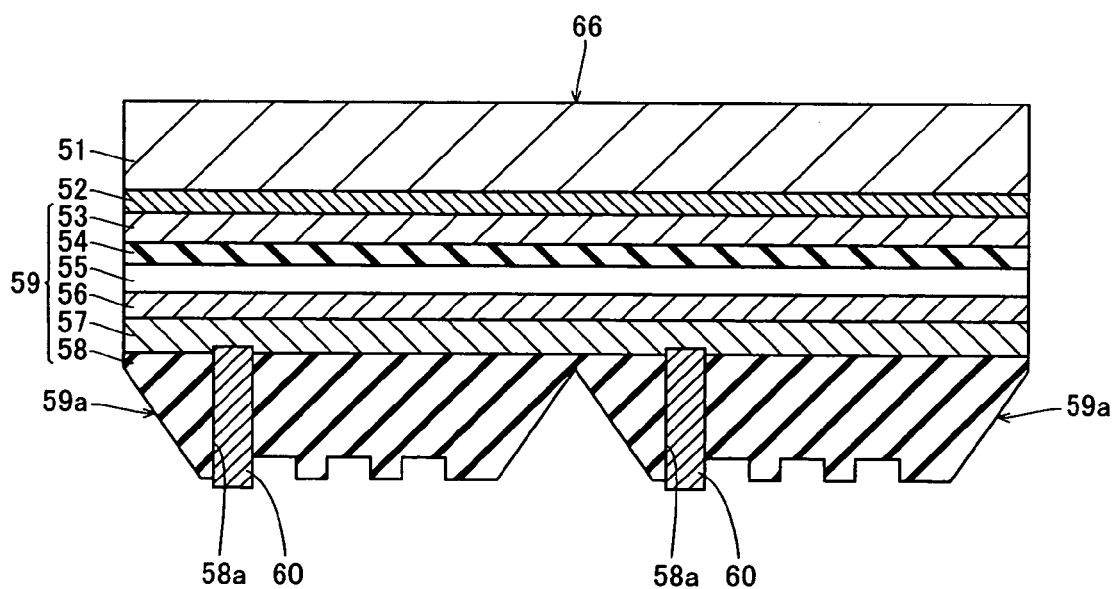

As shown in FIG. 26, the opening 58a is formed on a prescribed region of the light transmission layer 58 by etching, to expose the surface of the n-type contact layer 57. Thereafter the n-side electrode 60 having the composition and the thickness similar to those of the n-side electrode 10 in the aforementioned first embodiment is formed in the opening 58a of the light transmission layer 58a by vacuum evaporation or the like, to be in contact with the surface of the n-type contact layer 57. Finally, the device is separated from an adjacent device along an element isolation region 66 through a process similar to that of the first embodiment shown in FIG. 8. Thus, the nitride-based semiconductor light-emitting diode device according to the third embodiment is formed as shown in FIG. 19.

In the manufacturing process according to the third embodiment, the mask layer 63 is formed on the prescribed region of the Si substrate 62 and the light transmission layer 58 is thereafter grown on the Si substrate 62 so that the light transmission layer 58 is laterally grown to reduce the number of dislocations formed thereon, whereby the number of dislocations propagated to the active layer 55 grown on the light transmission layer 58 can be reduced. Thus, the dislocation density of the active layer 55 can be reduced, whereby emission efficiency in the active layer 55 as well as the lifetime of the device can be improved. Further, the light transmission layer 58 so consists of undoped GaN that lateral growth can be more prompted as compared with a case of growing a light transmission layer doped with an impurity such as Si. Thus, the surface of the light transmission layer 58 can be flattened with a small thickness.

Fourth Embodiment

Figure 27:
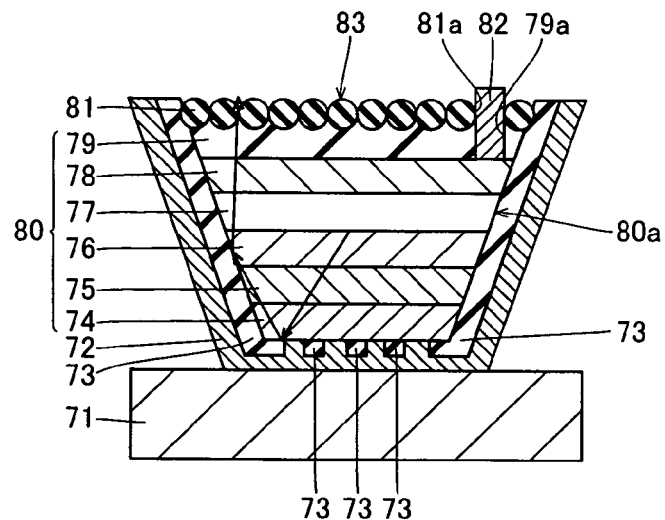
FIG. 27 is a sectional view showing the structure of a nitride-based semiconductor light-emitting diode device according to a fourth embodiment of the present invention.

Referring to FIG. 27, inclined side surfaces 80a of a nitride-based semiconductor element layer 80 and a light emission surface 83 form an acute angle while the inclined side surfaces 80a of the nitride-based semiconductor element layer 80 are provided with lateral reflecting films and the light emission surface 83 is corrugated in a nitride-based semiconductor light-emitting diode device according to a fourth embodiment of the present invention, dissimilarly to the aforementioned first to third embodiments. Referring to FIG. 27, arrows denote paths of light.

In the nitride-based semiconductor light emitting diode device according to the fourth embodiment, a p-side electrode 72 having a composition and a thickness similar to those of the p-side electrode 2 in the aforementioned first embodiment is bonded to a conductive support substrate 71 set on a side opposite to the light emission surface 83, as shown in FIG. 27. The p-side electrode 72 has a corrugated surface formed by recess portions, each having a depth of about 200 nm and a diameter of about 300 nm, arranged in the form of a triangular lattice at a grating space of about 600 nm. The p-side electrode 72 is an example of the "reflecting film" in the present invention.

An insulating film 73 of $SiO_2$ is formed on the p-side electrode 72, to fill up the recess portions of the corrugated surface of the p-side electrode 72. A p-type contact layer 74 of p-type $Ga_{0.95}In_{0.05}N$ doped with Mg having a thickness of about 0.05 µm is further formed on the p-side electrode 72. A p-type cladding layer 75 of p-type GaN doped with Mg having a thickness of about 0.1 µm is formed on the p-type contact layer 74. A p-type cap layer 76 of $Al_{0.05}Ga_{0.95}N$ doped with Mg having a thickness of about 5 nm is formed on the p-type cladding layer 75. An active layer 77 having an MQW structure is formed on the p-type cap layer 76. This active layer 77 has the MQW structure obtained by alternately stacking four well layers (not shown) of undoped $Ga_{0.75}In_{0.25}N$ each having a thickness of about 2.5 nm and three barrier layers (not shown) of undoped GaN each having a thickness of about 15 nm. An n-type contact layer 78 of n-type GaN doped with Si having a thickness of about 0.5 µm is formed on the active layer 77. This n-type contact layer 78 functions also as a cladding layer. A light transmission layer 79 of undoped GaN having a thickness of about 300 nm is formed on the n-type contact layer 78. The light transmission layer 79 has an opening 79a. The p-type contact layer 74, the p-type cladding layer 75, the p-type cap layer 76, the active layer 77, the n-type contact layer 78 and the light transmission layer 79 constitute the nitride-based semiconductor element layer 80. The nitride-based semiconductor element layer 80 is an example of the "semiconductor element layer" in the present invention.

According to the fourth embodiment, the nitride-based semiconductor element layer 80 has the side surfaces 80a inclined by a prescribed angle with respect to the normal of the light emission surface 83. More specifically, the semiconductor element layer 80 has the side surfaces 80a inclined by about 70°, to be tapered from the side of the light emission surface 83 toward the side of the support substrate 71. The inclined side surfaces 80a of the nitride-based semiconductor element layer 80 and the light emission surface 83 form an acute angle (about 70°). According to the fourth embodiment, the insulating film 73 is formed to extend along the inclined side surfaces 80a of the nitride-based semiconductor element layer 80. The p-side electrode 72 is formed to cover the insulating film 73 located on the inclined side surfaces 80a of the nitride-based semiconductor element layer 80. Portions of the p-side electrode 72 located on the inclined side surfaces 80a of the nitride-based semiconductor element layer 80 are examples of the "lateral reflecting film" in the present invention. According to the fourth embodiment, a single-layer $SiO_2$ film 81 of monodispersed $SiO_2$ particles having a diameter of about 50 nm and percentage coefficient of variation of not more than about 5% is formed on the light transmission layer 79 constituting the nitride-based semiconductor element layer 80. This SiO₂ film 81 has an opening 81a continuous to the opening 79a of the light transmission layer 79. The light emission surface 83 formed by the surface of the SiO₂ film 81 is corrugated in correspondence to the SiO₂ particles having the diameter of about 50 nm.

An n-side electrode 82 having a composition and a thickness similar to those of the n-side electrode 10 in the aforementioned first embodiment is formed in the openings 79a and 81a of the light transmission layer 79 and the SiO₂ film 81.

According to the fourth embodiment, as hereinabove described, the side surfaces 80a of the nitride-based semiconductor element layer 80 are inclined by about 70° so the nitride-based semiconductor element layer 80 is tapered from the side of the light emission surface 83 toward the side of the support substrate 71, whereby the path of light can be changed and a diffraction effect can be increased so that the angle of incidence of light upon the light emission surface 81 is smaller than the critical angle similarly to the aforementioned first to third embodiments. According to the fourth embodiment, further, the support substrate 71 is so set on the side opposite to the light emission surface 83 that light created in the nitride-based semiconductor element layer 80 (active layer 77) can be emitted from the light emission surface 83 opposite to the support substrate 71 similarly to the aforementioned first to third embodiments, whereby the light created in the active layer 77 can be emitted only through the nitride-based semiconductor element layer 80. Consequently, the light extraction efficiency can be improved through the inclined side surfaces 80a of the nitride-based semiconductor element layer 80 while inhibiting the light extraction efficiency from reduction resulting from reflection on the interface between a growth substrate and the nitride-based semiconductor element layer 80, similarly to the aforementioned first to third embodiments.

According to the fourth embodiment, in addition, the p-side electrode 72 is formed to extend along the inclined side surfaces 80a of the nitride-based semiconductor element layer 80 so that the quantity of light reflected on the inclined side surfaces 80a of the nitride-based semiconductor element layer 80 can be increased similarly to the aforementioned second embodiment, whereby the light extraction efficiency can be further improved. The insulating film 73 is so formed between the inclined side surfaces 80a of the nitride-based semiconductor element layer 80 and the p-side electrode 72 that the nitride-based semiconductor element layer 80 and the p-side electrode 72 provided along the side surfaces 80a thereof can be prevented from coming into contact with each other.

According to the fourth embodiment, further, the light transmission layer 79 of undoped GaN is so formed on the n-type contact layer 78 of n-type GaN that the light transmission layer 79 can be inhibited from light absorption resulting from impurity levels similarly to the aforementioned third embodiment, whereby the probability of absorption of light totally reflected on the light emission surface 83 can be reduced. Consequently, the light extraction efficiency can be further improved similarly to the aforementioned third embodiment.

According to the fourth embodiment, further, the single-layer SiO₂ film 81 of monodispersed SiO₂ particles is so formed on the light transmission layer 79 that Fresnel reflection of light can be reduced on the light emission surface 83 (interface between the light transmission layer 79 and the SiO₂ film 81 and the surface of the SiO₂ film 81). More specifically, the ratios of the light transmission layer 79 and the SiO₂ film 81 are gradually reduced and increased respectively from the side of the light transmission layer 79 toward the side of the SiO₂ film 81 on the interface therebetween, whereby the refractive index can be gradually changed from that of the light transmission layer 79 to that of the SiO₂ film 81. Similarly, the ratios of the SiO₂ film 81 and an air space are gradually reduced and increased respectively from the side of the SiO₂ film 81 toward the side of the air space on the interface between the surface of the SiO₂ film 81 and the air space, whereby the refractive index can be gradually changed from that of the SiO₂ film 81 to that of the air space. Thus, the refractive indices can be gradually changed on the interfaces between the light transmission layer 79 and the SiO₂ film 81 and between the surface of the SiO₂ film 81 and the air space respectively, whereby Fresnel reflection of light can be reduced.

According to the fourth embodiment, further, the surface of the p-side electrode 72 located between the support substrate 71 and the p-type contact layer 74 is so corrugated that light incident upon the interface between the p-type contact layer 74 and the p-side electrode 72 is diffracted through the corrugated surface of the p-side electrode 72. Thus, the path of light can be so changed that the angle of incidence of light upon the light emission surface 83 is smaller than the critical angle, whereby the light extraction efficiency can be further improved.

The remaining effects of the fourth embodiment are similar to those of the aforementioned first embodiment.

A manufacturing process for the nitride-based semiconductor light-emitting diode device according to the fourth embodiment is now described with reference to FIGS. 27 to 37.

Figure 28:
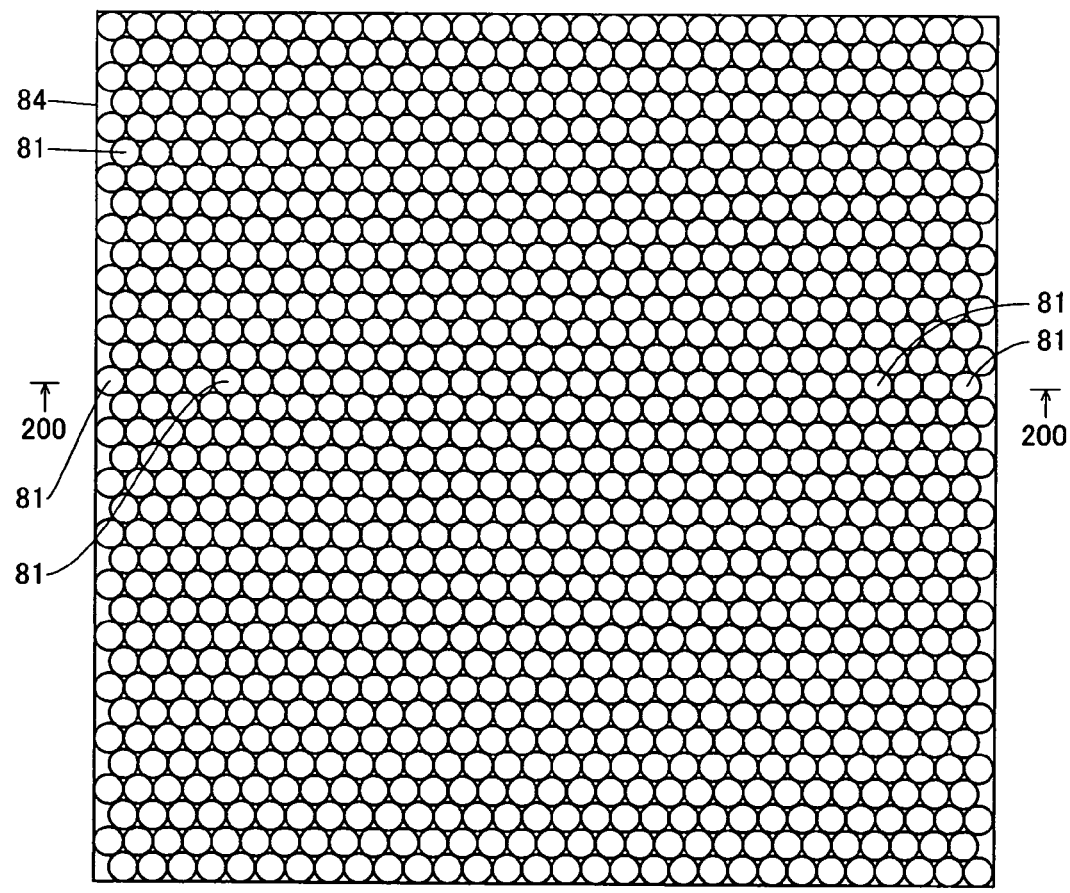
FIG. 28 is a plan view for illustrating a manufacturing process for the nitride-based semiconductor light-emitting diode device according to the fourth embodiment shown in FIG. 27.
Figure 29:
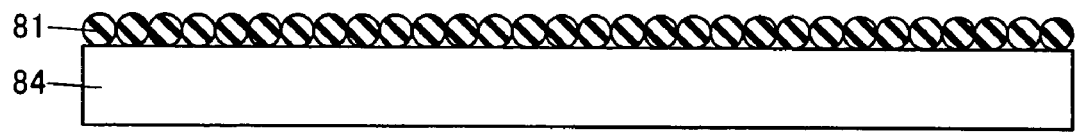
FIG. 29 is a sectional view taken along the line 200-200 in FIG. 28.

As shown in FIG. 28 (plan view) and FIG. 29 (sectional view taken along the line 200-200 in FIG. 28), the SiO₂ film 81 is formed on the (0001) plane of a GaN substrate 84 employed as a growth substrate by CVD. More specifically, the SiO₂ film 81 is so formed as to arrange the monodispersed SiO₂ particles having the diameter of about 50 nm and the percentage coefficient of variation of not more than about 5% in the form of a triangular lattice.

Figure 30:
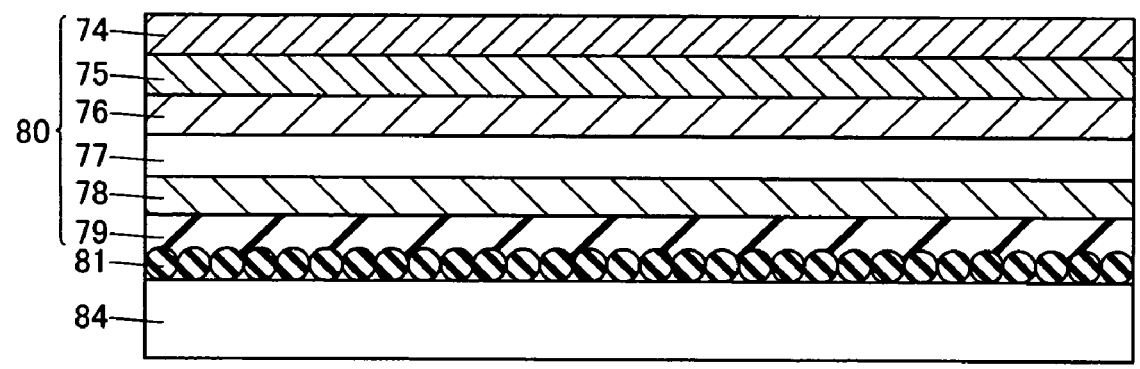
FIGS. 30 to 37 are sectional views for illustrating the manufacturing process for the nitride-based semiconductor light-emitting diode device according to the fourth embodiment shown in FIG. 27.

As shown in FIG. 30, the light transmission layer 79 of undoped GaN having the thickness of about 300 nm is grown on the GaN substrate 84 formed with the SiO₂ film 81 by MOCVD. At this time, the light transmission layer 79 is vertically selectively grown on portions of the GaN substrate 84 located on openings among the SiO₂ particles of the SiO₂ film 81 and thereafter laterally grown to cover the SiO₂ film 81, so that the surface thereof is flattened. Therefore, dislocations formed on the light transmission layer 79 are laterally bent to hardly form vertically propagated dislocations. Thus, the dislocation density of the light transmission layer 79 can be further reduced as compared with the GaN substrate 84 having relatively low dislocation density.

Then, the n-type contact layer 78 of n-type GaN doped with Si having the thickness of about 0.5 μm is grown on the light transmission layer 79. Thereafter the four well layers (not shown) of undoped Ga₀.₇₅In₀.₂₅N each having the thickness of about 2.5 nm and the three barrier layers (not shown) of undoped GaN each having the thickness of about 15 nm are alternately grown thereby forming the active layer 77 having the MQW structure obtained by alternately stacking the four well layers and the three barrier layers.

Then, the p-type cap layer 76 of Al₀.₀₅Ga₀.₉₅N doped with Mg having the thickness of about 5 nm is grown on the active layer 77. Thereafter the p-type cladding layer 75 of p-type GaN doped with Mg having the thickness of about 0.1 μm and the p-type contact layer 74 of p-type $Ga_{0.95}In_{0.05}N$ doped with Mg having the thickness of about 0.05 μm are successively grown on the p-type cap layer 76. Thus, the p-type contact layer 74, the p-type cladding layer 75, the p-type cap layer 76, the active layer 77, the n-type contact layer 78 and the light transmission layer 79 constitute the nitride-based semiconductor element layer 80. Thereafter the p-type contact layer 74, the p-type cladding layer 75 and the p-type cap layer 76 are converted to the p type by heat treatment or electron beam treatment.

Figure 31:
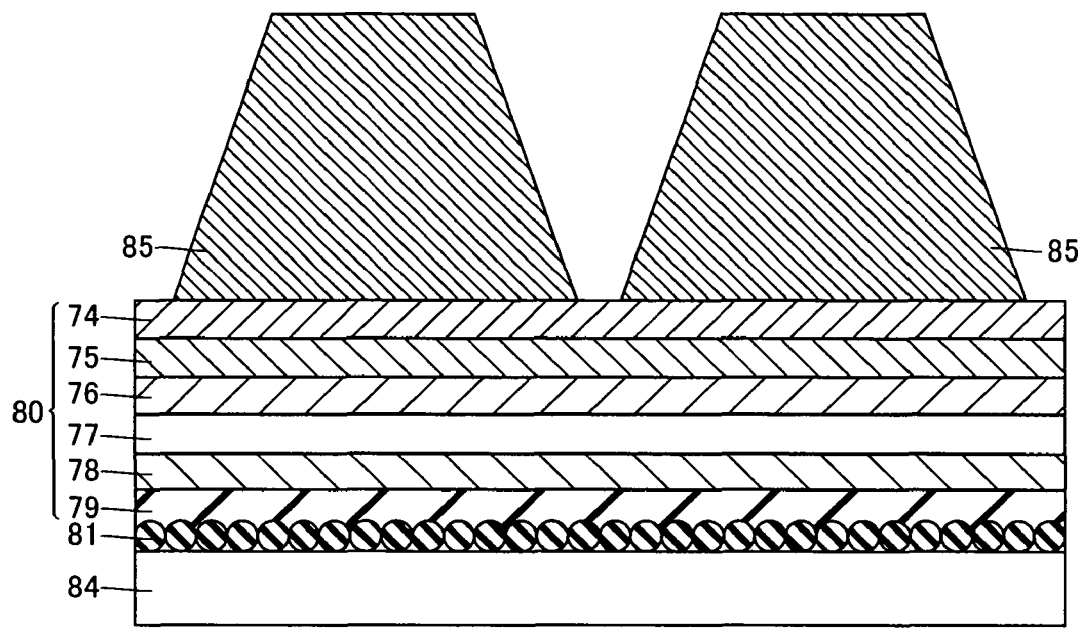

As shown in FIG. 31, a trapezoidal mask layer 85 of Al tapered oppositely to the n-type contact layer 74 is formed on the surface of the p-type contact layer 74 through a process similar to that of the first embodiment shown in FIG. 6.

Figure 32:
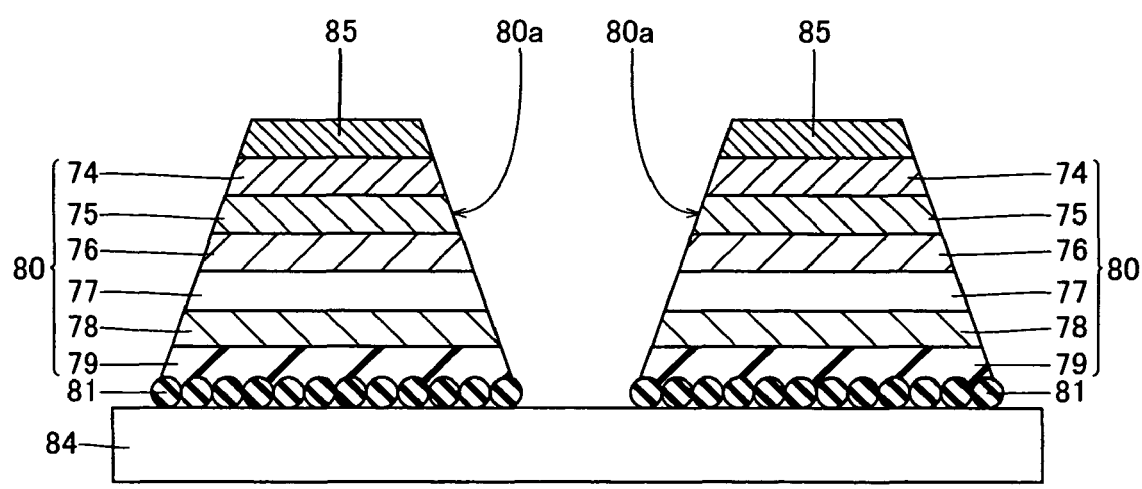

As shown in FIG. 32, the mask layer 85 and the nitride-based semiconductor element layer 80 as well as the $SiO_2$ film 81 are simultaneously etched until the etching depth reaches the surface of the GaN substrate 84 through a process similar to that of the first embodiment shown in FIG. 7. Thus, the nitride-based semiconductor element layer 80 is shaped to reflect the shape of the mask layer 85. In other words, the nitride-based semiconductor element layer 80 has the side surfaces 80*a* inclined by the prescribed angle with respect to the normal of the light emission surface 83 (see FIG. 27). More specifically, the nitride-based semiconductor element layer 80 is tapered from the side of the GaN substrate 84 toward the side of the p-type contact layer 74, while the side surfaces 80*a* of the nitride-based semiconductor element layer 80 and the surface of the p-type contact layer 74 form an obtuse angle (about 110°). Thereafter the mask layer 85 is removed through dilute hydrochloric acid.

Figure 33:
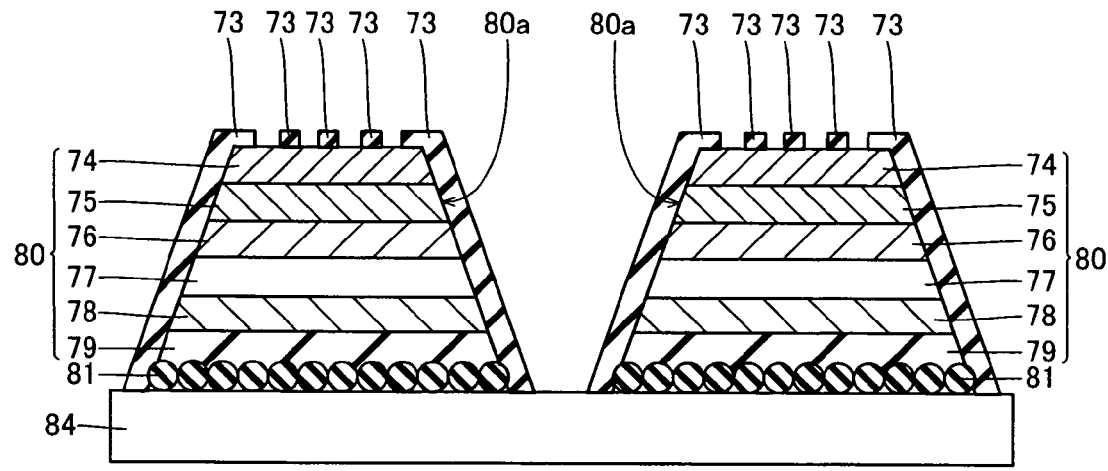

As shown in FIG. 33, an $SiO_2$ film (not shown) having a thickness of about 200 nm, for example, is formed by plasma CVD or the like to cover the overall surface of the nitride-based semiconductor element layer 80, and a portion of the $SiO_2$ film located on the p-type contact layer 74 is microprocessed. More specifically, prescribed regions of the $SiO_2$ film located on the p-type contact layer 74 are removed by photolithography and etching, for forming circular $SiO_2$ films having a diameter of about 300 nm in the form of a triangular lattice at a grating pitch of about 600 nm. Thus, the insulating film 73 of $SiO_2$ is formed to expose the prescribed regions located on the p-type contact layer 74.

Figure 34:
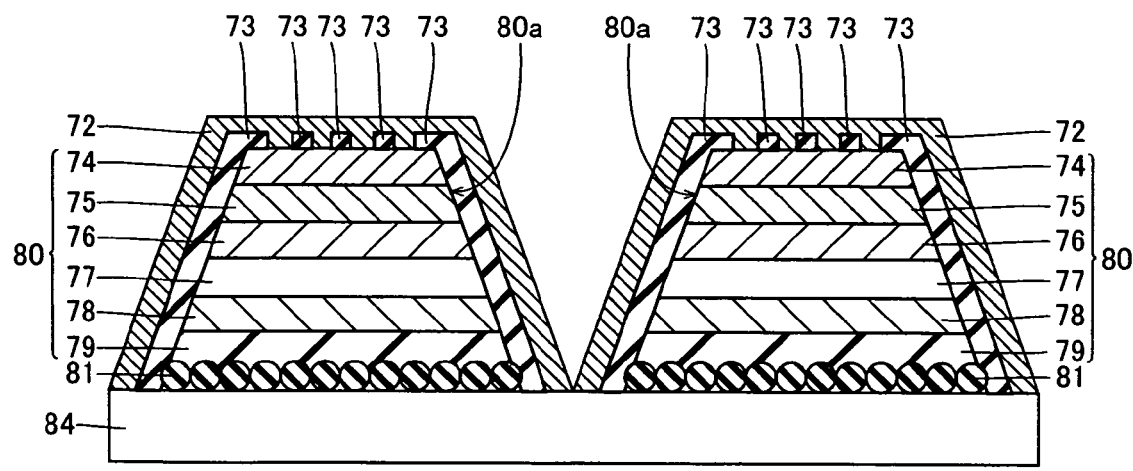

As shown in FIG. 34, the p-side electrode 72 having the composition and the thickness similar to those of the p-side electrode 2 in the aforementioned first embodiment is formed on the insulating film 73 by vacuum evaporation or the like, to be in contact with the surface of the p-type contact layer 74. Thus, the region of the p-side electrode 72 located on the p-type contact layer 74 is corrugated.

Figure 35:
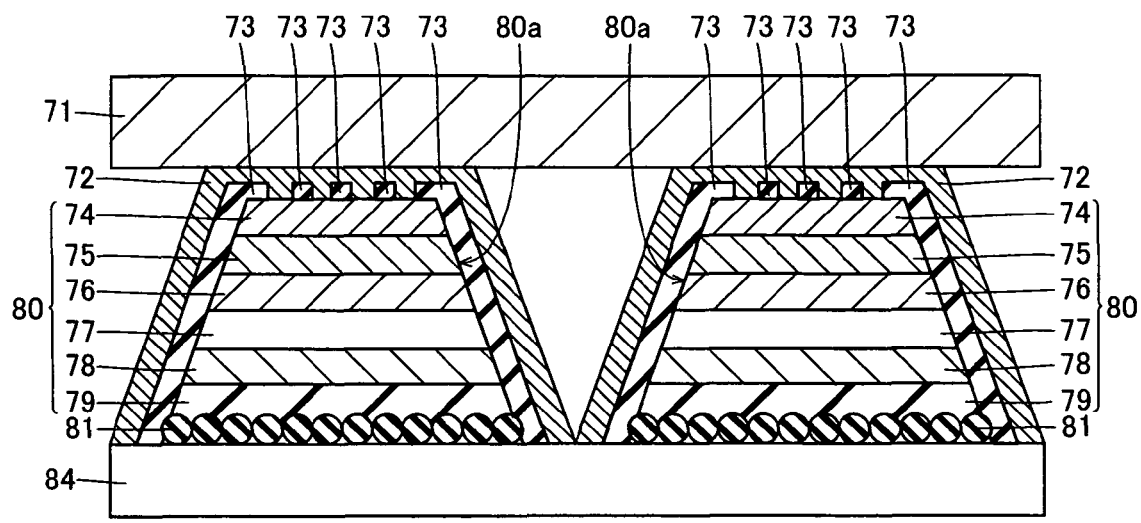
Figure 36:
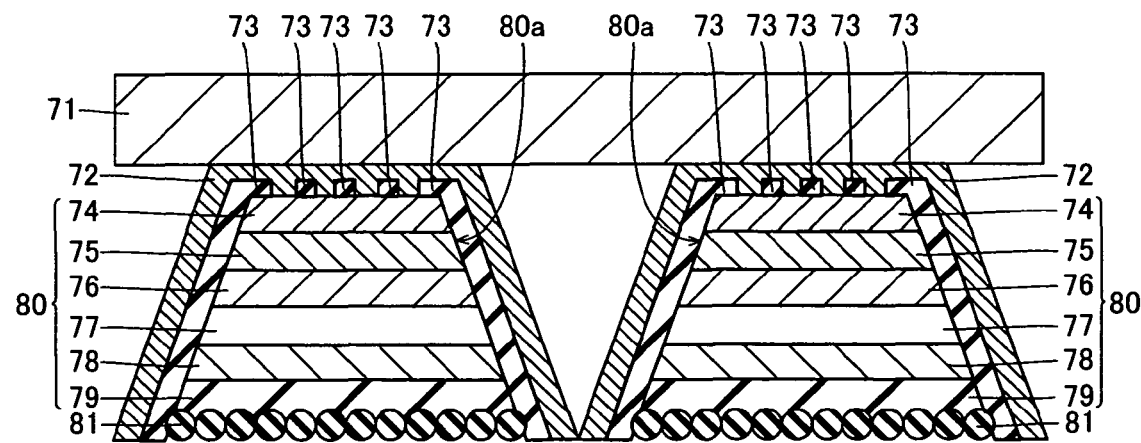

As shown in FIG. 35, the conductive support substrate 71 is bonded to the p-side electrode 72 through a process similar to that of the first embodiment shown in FIG. 4. Thereafter the GaN substrate 84 is removed by externally applying physical force. Thus, the $SiO_2$ film 81 is exposed as shown in FIG. 36.

Figure 37:
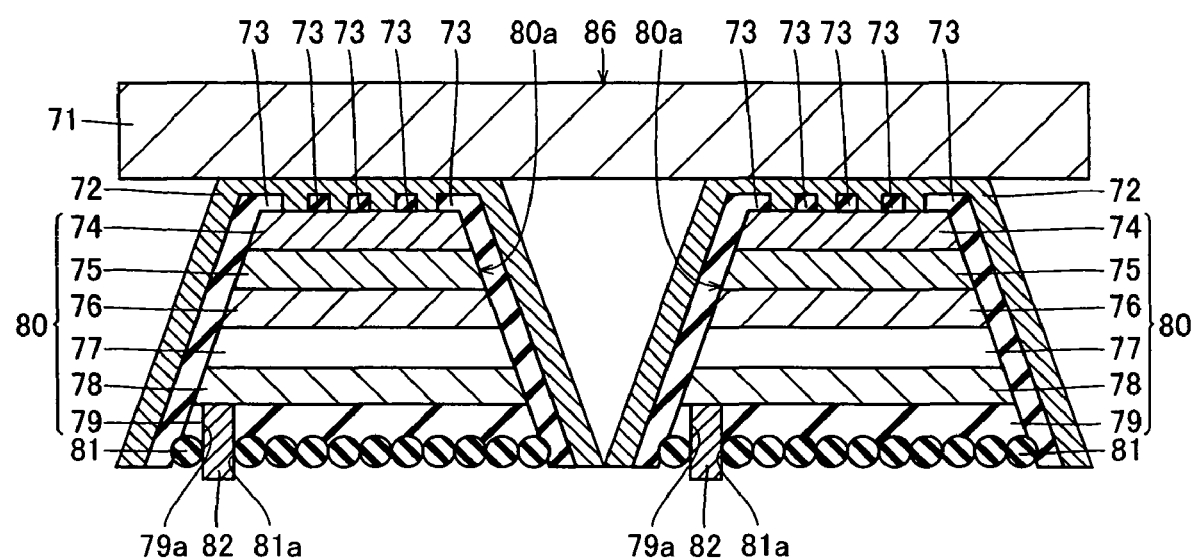

As shown in FIG. 37, the openings 81*a* and 79*a* are formed on prescribed regions of the $SiO_2$ film 81 and the light transmission layer 79 by etching respectively, to expose the surface of the n-type contact layer 78. The $SiO_2$ particles are so easy to etch that the opening 81*a* can be easily formed in the $SiO_2$ film 81 at this time. Thereafter the n-side electrode 82 having the composition and the thickness similar to those of the n-side electrode 10 in the aforementioned first embodiment is formed in the openings 81*a* and 79*a* of the $SiO_2$ film 81 and the light transmission layer 79 by vacuum evaporation or the like, to be in contact with the surface of the n-type contact layer 78.

Thereafter the device is separated from an adjacent device along an element isolation region 86, through a process similar to that of the first embodiment shown in FIG. 8. A space is provided between the inclined side surface 80*a* of the nitride-based semiconductor element layer 80 closer to the adjacent device and the corresponding side surface of a nitride-based semiconductor element layer of the device adjacent to the nitride-based semiconductor light-emitting diode device through the element isolation region 86. When the support substrate 71 is notched by dicing, therefore, a cutter can be inhibited from coming into contact with the nitride-based semiconductor element layer 80 similarly to the aforementioned second embodiment, whereby damage on the nitride-based semiconductor element layer 80 can be reduced. Thus, the nitride-based semiconductor light-emitting diode device according to the fourth embodiment is formed as shown in FIG. 27.

In the manufacturing process according to the fourth embodiment, as hereinabove described, the light transmission layer 79 is so grown on the GaN substrate 84 formed with the $SiO_2$ film 81 that the GaN layer constituting the light transmission layer 79 starting to laterally grow is coalesced with an adjacent GaN layer in an initial stage of the growth since the $SiO_2$ particles forming the $SiO_2$ film 81 have the small diameter of about 50 nm. Thus, the surface of the light transmission layer 79 can be flattened with a smaller thickness. Consequently, the GaN substrate 84 can be inhibited from warping or cracking resulting from a large thickness of the light transmission layer 79. Further, the light transmission layer 79 so consists of undoped GaN that lateral growth can be prompted similarly to the aforementioned third embodiment, whereby the surface of the light transmission layer 79 can be flattened with a smaller thickness also by this.

Although the present invention has been described and illustrated in detail, it is clearly understood that the same is by way of illustration and example only and is not to be taken by way of limitation, the spirit and scope of the present invention being limited only by the terms of the appended claims.

For example, while the nitride-based semiconductor element layer includes the layers of GaN, AlGaN and InGaN in each of the aforementioned first to fourth embodiments, the present invention is not restricted to this but the nitride-based semiconductor element layer may alternatively include layers of nitride-based semiconductors other than GaN, AlGaN and InGaN. For example, a layer of a group III-V nitride-based semiconductor such as AlN (aluminum nitride), InN (indium nitride), BN (boron nitride) or TlN (thallium nitride) or a mixed crystal of the group III-V nitride-based semiconductor can conceivably be employed. Further, mixed crystals prepared by introducing at least one of As, P and Sb into the aforementioned group III-V nitride semiconductors and mixed crystals thereof are also conceivable. In addition, the present invention is also applicable to a semiconductor element layer including a layer of an oxide-based semiconductor such as ZnO. Each semiconductor may have a wurtzite crystal structure or a zinc blende crystal structure.

While the surface of each nitride-based semiconductor layer is oriented along the (0001) plane in each of the aforementioned first to fourth embodiments, the present invention is not restricted to this but the surface of each nitride-based semiconductor layer may alternatively be oriented along another plane. For example, the surface of each nitride-based semiconductor layer may be oriented along a (H, K, -H-K, O) plane such as the (1-100) plane or the (11-20) plane.

While the nitride-based semiconductor layers are crystal-grown by MOCVD in each of the aforementioned first to fourth embodiments, the present invention is not restricted to this but the nitride-based semiconductor layers may alternatively be crystal-grown by HVPE (halide vapor phase epitaxy) or gas-source MBE (molecular beam epitaxy).

While the sapphire, SiC, Si or GaN substrate is employed as a growth substrate in each of the aforementioned first to fourth embodiments, the present invention is not restricted to this but a GaAs, MgO, ZnO or spinel substrate may alternatively be employed as a growth substrate.

While the p-side electrode is formed by the Ag and Al layers in each of the aforementioned first, third and fourth embodiments, the present invention is not restricted to this but the thicknesses of or the materials for the metal layers constituting the p-side electrode may be varied with the emission wavelength for reducing light absorption in the p-side electrode. The p-side electrode may be formed entirely or partially on the surface of the nitride-based semiconductor element layer. When the p-side electrode is formed only partially on the surface of the nitride-based semiconductor element layer, a layer for reflecting light is preferably formed on a region other than that formed with the p-side electrode. Further, a pad electrode is preferably formed between the p-side electrode and the conductive substrate, in order to reinforce the bonding power therebetween. When the p-side electrode is bonded to the conductive substrate through solder, a barrier metal layer of Pt or Pd is preferably formed as a protective film or the p-side electrode.

While the n-side electrode, formed by the ohmic electrode layer of Al, the barrier metal layer of Pt or Ti and the pad metal layer of Au or Au—Sn, incapable of transmitting light is employed in each of the aforementioned first, third and fourth embodiments, the present invention is not restricted to this but an n-side electrode formed by a transparent material or the like capable of transmitting light may alternatively be employed. In this case, a pad electrode layer is preferably formed partially on the n-side electrode, in order to connect a gold wire.

While the $SiO_2$ film of $SiO_2$ particles is employed in the aforementioned fourth embodiment, the present invention is not restricted to this but a material reducing light absorption may alternatively be employed in response to the emission wavelength. The refractive index of this film may be remarkably different from that of the nitride-based semiconductor, since the refractive index can be gradually changed. For example, this film may consist of $Al_2O_3$ particles or $SiN_x$ particles. Further, the film may consist of a material not be reacted and fused during crystal growth. For example, the film may consist of particles of a high melting point metal such as W, Ta or Mo, or $TiO_2$ particles.

While the n-side electrode 22 or the p-side electrode 72 functioning as a reflecting film is formed to extend not only on the junction interface between the support substrate and the semiconductor element layer but also on the inclined side surfaces of the semiconductor element layer in each of the aforementioned second and fourth embodiments, the present invention is not restricted to this but an n-side electrode or a p-side electrode functioning as a reflecting film may alternatively formed only on the junction interface between the support substrate and the semiconductor element layer while forming lateral reflecting films on the inclined side surfaces of the semiconductor element layer independently of the n- or p-side electrode.

While the light emission surface is corrugated in each of the aforementioned second to fourth embodiments, the present invention is not restricted to this but the light emission surface may have other structures causing diffraction. For example, a structure of which refractive index is periodically modulated are conceivably employed as the light emission surface.

While the surface of the reflecting film closer to the semiconductor layer is corrugated in the aforementioned fourth embodiment, the present invention is not restricted to this but the interface between the reflecting film and the semiconductor layer may have other structures causing diffraction. For example, a refractive index around the surface of the semiconductor layer closer to the reflecting film may be periodically modulated or an interlayer of which refractive index is periodically modulated may be inserted between the reflecting film and the semiconductor layer.

What is claimed is:

1. A light-emitting device comprising:
a support substrate;
a nitride-based semiconductor element layer on the support substrate, having a first surface which is a light emission surface and a second surface which faces the support substrate, the semiconductor element layer having an active layer having a third surface which faces the light emission surface and a fourth surface which faces the support substrate, the third and fourth surfaces opposite to each other, a first semiconductor layer between the first surface and the third surface, and a second semiconductor layer between the second surface and the fourth surface, wherein the light emission surface emits light to be created in the active layer; and
a reflecting film between the support substrate and the second semiconductor layer, wherein
the second surface is bonded to the support substrate through the reflecting film,
the first semiconductor layer has a thickness from the light emission surface to the third surface, and the second semiconductor layer has a thickness from the second surface to the fourth surface,
the thickness of the first semiconductor layer is greater than the thickness of the second semiconductor layer,
the semiconductor element layer has a side surface inclined with respect to the light emission surface such that the semiconductor element layer is tapered toward the light emission surface, the inclined side surface being inclined linearly and continuously extending from an edge of the second surface to an edge of the light emission surface,
the reflecting film has a fifth surface in contact with the second surface, and a sixth surface opposite to the fifth surface, the reflecting film having a side surface which extends from an edge of the fifth surface to an edge of the sixth surface and is inclined with respect to the inclined side surface of the semiconductor element layer, the inclined side surface of the semiconductor element layer extending to reach the fifth surface, and
the semiconductor element layer has a first angle formed by the inclined side surface of the semiconductor element layer and the light emission surface, the reflecting film has a second angle formed by the side surface of the reflecting film and the fifth surface, and the first angle is greater than the second angle.

2. The light-emitting device according to claim 1, wherein the side surface of the semiconductor element layer inclined with respect to the light emission surface includes a side surface of the active layer.

3. The light-emitting device according to claim 1, wherein the reflecting film is bonded to an upper surface of the support substrate through solder or through conductive paste, and the semiconductor element layer is formed on the reflecting film.

4. The light-emitting device according to claim 1, wherein the reflecting film includes an Ag layer.

5. The light-emitting device according to claim 1, wherein an n-side electrode is formed on the semiconductor element layer closer to the light emission surface, and
the n-side electrode comprises an ohmic electrode layer, a barrier metal layer and a pad metal layer successively from the side closer to the semiconductor element layer.

6. The light-emitting device according to claim 5, wherein the ohmic electrode layer is formed by an Al layer, the barrier metal layer is formed by a Pt or Ti layer, and the pad metal layer is formed by an Au or Au—Sn layer.

7. The light-emitting device according to claim 1, wherein the first semiconductor layer has an n-type contact layer, and
the second semiconductor layer has a p-type contact layer and a cap layer,
the cap layer being between the p-type contact layer and the active layer.

8. The light-emitting device according to claim 1, wherein the light emission surface has a corrugated region.

9. The light-emitting device according to claim 8, wherein an n-side electrode is located in the corrugated region.

10. The light-emitting device according to claim 1, wherein the support substrate is a conductive substrate.

11. The light-emitting device according to claim 1, wherein the support substrate consists of any semiconductor of Si, SiC, GaAs, and ZnO, any metal of Al, Fe—Ni and Cu—W, or a metal and a metal oxide of Cu—CuO.

12. The light-emitting device according to claim 7, wherein the cap layer consists of an AlGaN layer.

13. The light-emitting device according to claim 1, wherein the first semiconductor layer comprises a cladding layer and a contact layer.

14. The light-emitting device according to claim 1, wherein the second semiconductor layer comprises a cladding layer and a contact layer.

15. The light-emitting device according to claim 1, wherein the second semiconductor layer comprises a cladding layer and a cap layer.

16. The light-emitting device according to claim 1, wherein the second semiconductor layer comprises a contact layer and a cap layer.

17. The light-emitting device according to claim 1, wherein the fifth surface is parallel to the light emission surface.

18. The light-emitting device according to claim 1, wherein the side surface of the reflecting film extends in a direction perpendicular to the fifth surface.

19. The light-emitting device according to claim 1, wherein the fifth surface is parallel to the light emission surface, and the side surface of the reflecting film extends in a direction perpendicular to the fifth surface.

* * * * *